US012615096B2

(12) United States Patent
Zhang et al.

(10) Patent No.: US 12,615,096 B2
(45) Date of Patent: Apr. 28, 2026

(54) TESTER CHANNEL MULTIPLEXING IN TEST EQUIPMENT

(71) Applicant: YANGTZE MEMORY TECHNOLOGIES CO., LTD., Wuhan (CN)

(72) Inventors: Yangyang Zhang, Wuhan (CN); Feng Ru, Wuhan (CN); Yi Chen, Wuhan (CN); Mengda Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 36 days.

(21) Appl. No.: 18/899,981

(22) Filed: Sep. 27, 2024

(65) Prior Publication Data

US 2025/0023646 A1     Jan. 16, 2025

Related U.S. Application Data

(63) Continuation of application No. 17/539,704, filed on Dec. 1, 2021, now Pat. No. 12,136,958, which is a
(Continued)

(51) Int. Cl.
*H04B 17/00* (2015.01)
*G01R 31/319* (2006.01)

(52) U.S. Cl.
CPC ... *H04B 17/0085* (2013.01); *G01R 31/31919* (2013.01); *G01R 31/31924* (2013.01)

(58) Field of Classification Search
CPC .......... H04B 17/0085; G01R 31/31924; G01R 31/31919
(Continued)

(56) References Cited

U.S. PATENT DOCUMENTS 5,432,797 A * 7/1995 Takano ............ G01R 31/31919
714/724
5,579,251 A * 11/1996 Sato ................. G01R 31/31922
714/739
(Continued)

FOREIGN PATENT DOCUMENTS

CN         1591035 A     3/2005
CN      106950486 A     7/2017
(Continued)

OTHER PUBLICATIONS

International Search Report issued in corresponding International Application No. PCT/CN2021/127747, mailed Jun. 24, 2022, 5 pages.
(Continued)

*Primary Examiner* — John J Tabone, Jr.
(74) *Attorney, Agent, or Firm* — BAYES PLLC

(57) ABSTRACT

A test equipment includes a selection register configured to store a selection index determined based on a selection command, a first tester channel including a first waveform driving device, and a second tester channel including a second waveform driving device. Each of the first tester channel and the second tester channel is multiplexed by a plurality of Device Under Test (DUTs). The first waveform driving device and the second waveform driving device are coupled to the selection register. The first waveform driving device is configured to generate, based on a driving source signal, a first waveform signal for driving multiple of first pins of the plurality of DUTs, and control, based on the selection index and a first bit map corresponding to the first tester channel, an output of the first waveform signal through the first tester channel. The second waveform driving device is configured to generate, based on the driving source signal, a second waveform signal for driving multiple of second pins of the plurality of DUTs, and control, based on the
(Continued)

selection index and a second bit map corresponding to the second tester channel, an output of the second waveform signal through the second tester channel.

20 Claims, 10 Drawing Sheets

Related U.S. Application Data continuation of application No. PCT/CN2021/127747, filed on Oct. 30, 2021.

(58) Field of Classification Search
USPC ................................. 714/738, 739, 741, 742
See application file for complete search history.

(56) References Cited

U.S. PATENT DOCUMENTS

| | | | | |
|---|---|---|---|---|
| 5,970,073 | A | 10/1999 | Masuda et al. | |
| 6,028,439 | A * | 2/2000 | Arkin ............... | G01R 31/31907 |
| | | | | 324/537 |
| 6,076,179 | A * | 6/2000 | Hendricks ........ | G01R 31/31926 |
| | | | | 714/742 |
| 6,412,087 | B1 * | 6/2002 | Matsumoto ...... | G01R 31/31919 |
| | | | | 714/743 |
| 7,013,417 | B1 * | 3/2006 | Burlison ........ | G01R 31/318552 |
| | | | | 714/744 |
| 7,586,950 | B1 * | 9/2009 | Damle .................. | H04L 67/025 |
| | | | | 370/236 |
| 7,958,524 | B2 * | 6/2011 | Juneau ................. | H04N 21/437 |
| | | | | 725/35 |
| 12,136,958 | B2 * | 11/2024 | Zhang .............. | G01R 31/31919 |
| 2002/0009081 | A1 | 1/2002 | Sampath et al. | |
| 2004/0039977 | A1 | 2/2004 | Cullen et al. | |
| 2007/0076872 | A1 * | 4/2007 | Juneau ............... | H04N 7/17345 |
| | | | | 380/202 |
| 2016/0245864 | A1 * | 8/2016 | Mydill ............. | G01R 31/31908 |
| 2019/0042780 | A1 | 2/2019 | Brannock et al. | |
| 2023/0133863 | A1 * | 5/2023 | Zhang .............. | G01R 31/31919 |
| | | | | 370/241 |
| 2025/0023646 | A1 * | 1/2025 | Zhang .............. | G01R 31/31919 |

FOREIGN PATENT DOCUMENTS

| | | |
|---|---|---|
| CN | 109799373 A | 5/2019 |
| CN | 111752484 A | 10/2020 |
| CN | 113272906 A | 8/2021 |
| EP | 1550879 A1 | 7/2005 |
| JP | 2000098997 A | 4/2000 |

OTHER PUBLICATIONS

Zeng et al., Concurrent Core Test for SOC Using Shared Test Set and Scan Chain Disable, 2006, EDAA, pp. 1045-1050. (Year: 2006).

Chinese First Office Action for CN 202180003903.3, Mar. 31, 2023, Global Dossier, pp. 1-14. (Year: 2023).

International Written Opinion for PCT/CN2021/127747, Jun. 20, 2022, Global Dossier, pp. 1-6. (Year: 2022).

* cited by examiner

TABLE 1

| TESTER CHANNEL | DRIVING ENABLEMENT |
|---|---|
| TCH_0 | 1 |
| TCH_1 | 1 |
| TCH_2 | 1 |
| ⋮ | ⋮ |
| TCH_n | 1 |

TABLE 2: DECODE ADDRESS = 2, INTERPRETED DSEL ID = 3

| TESTER CHANNEL | DECODE ID | DSEL ID | DRIVING ENABLEMENT |
|---|---|---|---|
| TCH_0 | 0 | 3 | 0 |
| TCH_1 | 1 | 0 | 0 |
| TCH_2 | 2 | 3 | 1 |
| ⋮ | ⋮ | ⋮ | ⋮ |
| TCH_n-2 | 2 | 3 | 1 |
| TCH_n-1 | 2 | 1 | 0 |

TABLE 3: SELECTION INDEX = 3

| TESTER CHANNEL | BIT MAP | DRIVING ENABLEMENT |
|---|---|---|
| TCH_0 | BM=101...1101 | 1 |
| TCH_1 | BM=111...0110 | 0 |
| TCH_2 | BM=011...1011 | 1 |
| ⋮ | ⋮ | ⋮ |
| TCH_n-2 | BM=110...0110 | 0 |
| TCH_n-1 | BM=100...0110 | 0 |

FIG. 6

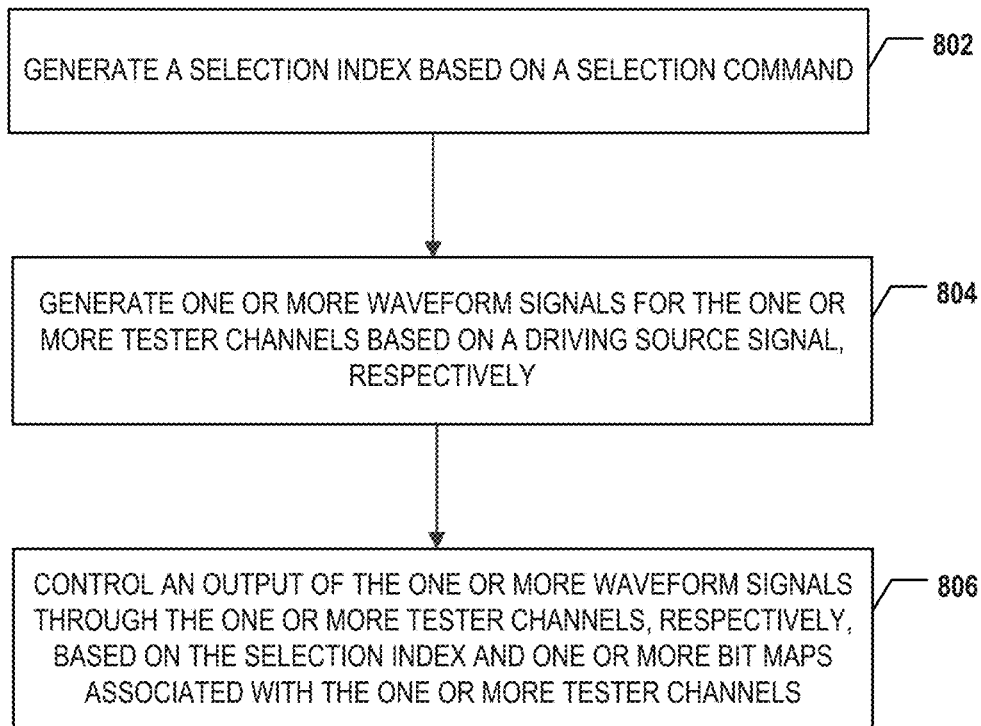

800

GENERATE A SELECTION INDEX BASED ON A SELECTION COMMAND — 802

GENERATE ONE OR MORE WAVEFORM SIGNALS FOR THE ONE OR MORE TESTER CHANNELS BASED ON A DRIVING SOURCE SIGNAL, RESPECTIVELY — 804

CONTROL AN OUTPUT OF THE ONE OR MORE WAVEFORM SIGNALS THROUGH THE ONE OR MORE TESTER CHANNELS, RESPECTIVELY, BASED ON THE SELECTION INDEX AND ONE OR MORE BIT MAPS ASSOCIATED WITH THE ONE OR MORE TESTER CHANNELS — 806

FIG. 8

TESTER CHANNEL MULTIPLEXING IN TEST EQUIPMENT

CROSS-REFERENCE TO RELATED APPLICATIONS

This application is a continuation of U.S. application Ser. No. 17/539,704, filed on Dec. 1, 2021, which is continuation of International Application No. PCT/CN2021/127747, filed on Oct. 30, 2021, entitled "TESTER CHANNEL MULTI-PLEXING IN TEST EQUIPMENT," both of which are hereby incorporated by reference herein in their entireties.

BACKGROUND

The present disclosure relates to a test equipment of electronic devices.

A test equipment can organize a test for one or more devices under test (DUTs) into a set of successive test cycles, and perform test activities for the one or more DUTs during each test cycle. The test equipment can include a set of tester channels, with each tester channel coupled to one or more pins of the one or more DUTs, respectively. During a test cycle, the test equipment may supply a driving source signal to the set of tester channels, respectively. If a tester channel from the set of tester channels is enabled, the tester channel can drive one or more corresponding pins of the one or more DUTs coupled to the tester channel to carry out a test activity based on the driving source signal.

SUMMARY

In one aspect, a waveform driving device for a tester channel includes a waveform generator, a bit map register, and an output logic circuit. The waveform generator is configured to generate a waveform signal based on a driving source signal. The bit map register is configured to store a bit map associated with the tester channel. The output logic circuit is coupled to the bit map register and the waveform generator, and configured to control an output of the waveform signal through the tester channel based on a bit control signal from the bit map.

In another aspect, a test equipment includes a plurality of tester channels. Each of the tester channels includes a waveform generator, a bit map register, and an output logic circuit. The waveform generator is configured to generate a waveform signal based on a driving source signal. The bit map register is configured to store a bit map associated with the tester channel. The output logic circuit is coupled to the bit map register and the waveform generator, and configured to control an output of the waveform signal through the tester channel based on a bit control signal from the bit map.

In still another aspect, a test equipment includes a selection register and one or more waveform driving devices for one or more tester channels. The selection register is configured to store a selection index. The selection index is determined based on a selection command. The one or more waveform driving devices are coupled to the selection register and configured to generate one or more waveform signals for the one or more tester channels based on a driving source signal, respectively. The one or more waveform driving devices are further configured to control an output of the one or more waveform signals through the one or more tester channels, respectively, based on the selection index and one or more bit maps associated with the one or more tester channels.

In yet another aspect, a method for controlling one or more tester channels in a test equipment is provided. A selection index is generated based on a selection command. One or more waveform signals for the one or more tester channels are generated based on a driving source signal, respectively. An output of the one or more waveform signals through the one or more tester channels, respectively, is controlled based on the selection index and one or more bit maps associated with the one or more tester channels.

In yet another aspect, a method for controlling a tester channel in a test equipment is disclosed. A bit map associated with the tester channel is obtained. A waveform signal is generated based on at least one of a driving source signal or a timing format. An output of the waveform signal through the tester channel is controlled based on a bit control signal from the bit map.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 6 illustrates a graphical representation of an exemplary comparison among different control processes for controlling one or more tester channels, according to some aspects of the present disclosure.

FIG. 8 illustrates a flowchart of an exemplary method for controlling one or more tester channels in a test equipment, according to some aspects of the present disclosure.

Figure 1:
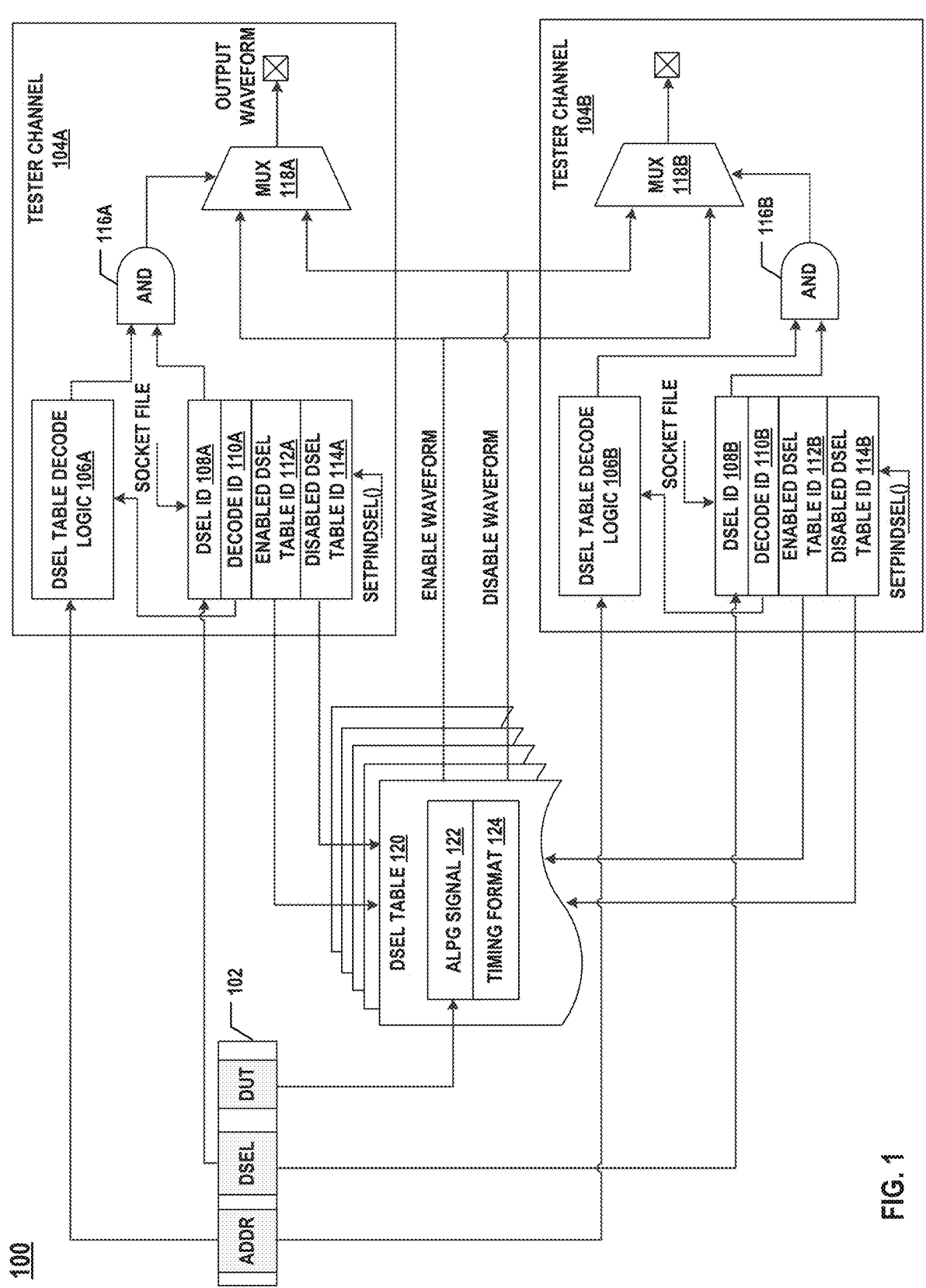
FIG. 1 illustrates a schematic diagram of an exemplary existing control process for controlling one or more tester channels multiplexed by a plurality of DUTs.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

A test equipment such as an automatic test equipment (ATE) may include a plurality of tester channels. Each tester channel may be configured to output a waveform signal to drive a plurality of pins from a plurality of DUTs that are coupled to the tester channel receive corresponding signals returned by the plurality of pins. Due to the high cost of hardware of the tester channels, the total number of tester channels in the test equipment is limited. Each tester channel in the test equipment can be multiplexed by a plurality of DUTs so that a test cost per DUT can be reduced.

For example, when a tester channel is multiplexed by a plurality of DUTs, the tester channel may be simultaneously coupled to a plurality of pins from the plurality of DUTs. The tester channel may be configured to drive the plurality of pins from the plurality of DUTs. For example, when the plurality of DUTs are under test, the tester channel may be physically connected to the plurality of pins from the plurality of DUTs, respectively. The plurality of pins can be pins of the same type (e.g., the plurality of pins being write enable (WE) pins or another suitable type of pins), or pins of different types (e.g., the plurality of pins including WE pins, chip enable (CE) pins, and/or any other suitable type of pins simultaneously). In this case, the tester channel can be reused by the plurality of pins from the plurality of DUTs. Thus, a test cost per tester channel can be shared among the plurality of DUTs, and a test cost per DUT can be reduced. In another example, a first tester channel and a second tester channel may be multiplexed by a plurality of DUTs. The first tester channel may be coupled to a plurality of first pins from the plurality of DUTs, and configured to drive the plurality of first pins. The second tester channel may be coupled to a plurality of second pins from the plurality of DUTs, and configured to drive the plurality of second pins. In this case, the first tester channel can be reused by the plurality of first pins from the plurality of DUTs, and the second tester channel can be reused by the plurality of second pins from the plurality of DUTs. Thus, a test cost per DUT can be reduced.

In contrast, in a scenario without tester channel multiplexing, each tester channel in the test equipment may be coupled to a single pin of a single DUT (e.g., one tester channel coupled to one pin of one DUT), and the total number of DUTs tested by the test equipment can be relatively limited. A test cost per DUT can be relatively high. For example, the test equipment may include 128 tester channels and is used to test single data rate (SDR) NAND memory devices. The total number of pins to be tested in each SDR NAND memory device is 22. If tester channel multiplexing is not applied in the test equipment, a maximum of 5 SDR NAND memory devices can be tested by the test equipment simultaneously. Thus, a test cost per DUT can be relatively high.

By applying tester channel multiplexing in the test equipment, one or more tester channels in the test equipment can be multiplexed by a plurality of DUTs. Each of the one or more tester channels may be physically coupled to a plurality of pins such as a plurality of chip enable (CE) pins or a plurality of write enable (WE) pins from the plurality of DUTs. The test equipment may implement a control process to control the one or more tester channels. Exemplary factors that may affect control of the one or more tester channels may include, but are not limited to, one or more of the following: (1) an allocation or assignment of the tester channels to the DUTs to achieve a maximal utilization efficiency of the tester channels; (2) the number of tester channels needed to test a certain number of DUTs; (3) logic resources or computational resources in the test equipment that are consumed by each tester channel; (4) complexity of programming in an algorithmic pattern generator (ALPG) and complexity of controlling the ALPG by a test program; and (5) the number of driving source signals outputted by the ALPG (e.g., the complexity of the ALPG), etc.

A first existing control process to control one or more tester channels multiplexed by DUTs may be implemented using a DUT control (DUTCTRL) command to carry DUTCTRL bits. For example, the DUTCTRL command can be used to carry an immediate operand represented by the DUTCTRL bits. The DUTCTRL bits carried by the DUTCTRL command may be mapped to corresponding DUT pins through a pin scramble multiplexer. Each DUTCTRL bit in an ALPG instruction may be used to control a driving of a corresponding pin of a DUT. For example, when a tester channel is multiplexed by a plurality of DUTs, the DUTCTRL bits have to be modified continuously in order to drive the pins from the plurality of DUTs, respectively. Thus, programming of the DUTCTRL bits in the DUTCTRL command can be complicated and prone to errors in the first existing control process. Besides, the first existing control process does not have a DUT selection function. For example, the plurality of DUTs cannot be selected independently in the first existing control process. Additionally, when a driving source signal is provided to n tester channels simultaneously, the first existing control process may fail to control the n tester channels independently, where n is a positive integer.

It is noted that when a driving source signal is provided to n tester channels simultaneously, a 1:n driving-source-signal-to-tester-channel (DSS-to-TCh) mapping relationship can be established between the driving source signal and the n tester channels (e.g., denoted as DSS:TCh=1:n). When m driving source signals are provided to n tester channels simultaneously, an men DSS-to-TCh mapping relationship can be established between the m driving source signals and the n tester channels (e.g., DSS:TCh=m:n), where m is a positive integer.

A second existing control process to control one or more tester channels multiplexed by the DUTs may be implemented at least through the following software settings: (1) configuring a DUT selection function through a DSEL/ALLDSEL command (e.g., a selection of DSELTchn), where the DSEL (or ALLDSEL) command indicates a selection of a DUT (or a selection of all the DUTs); (2) defining the tester channels included in the DSELTchn in a socket file, which is a formatted file; (3) creating 5 DSEL tables, where each DSEL table associates a driving source signal (e.g., an ALPG signal) with a timing format; (4) configuring decode logic to map the DUT pins to the DSEL tables; and (5) setting a DSEL decode address for each tester channel. When a driving source signal is provided to n tester channels simultaneously (e.g., when DSS:TCh=1:n is applied), the second existing control process may control the n tester channels independently.

However, the second existing control process requires complicate hardware implementation as well as complicate software implementation (e.g., with a requirement of the at least 5 software settings described above, the programming of which is not user-friendly). Besides, the DSS-to-TCh mapping relationship between the driving source signal and the tester channels is dependent on the DSEL tables. Since there are only 5 DSEL tables with a limited number of driving source signals and a limited number of timing formats, the total number of waveform signals generated and managed by the second existing control process is limited. Additionally, control of the tester channels in the second existing control process not only depends on a DSEL command in a DSEL field of the ALPG instruction, but also depends on other commands in the ALPG instruction such as an X/Y address command in an address field and a DUT command in a DUT field. This may add complexity to the application of the second existing control process. Further description of the second existing control process is provided below with reference to FIG. 1.

To address one or more of the aforementioned issues, the present disclosure introduces a solution in which n tester channels in a test equipment can be multiplexed by a plurality of DUTs and can also be controlled independently for any DSS-to-TCh mapping relationship. For example, an output of one or more waveform signals through the one or more tester channels can be controlled based on a selection index and one or more bit maps associated with the one or more tester channels. The solution disclosed herein supports a 1:n DSS-to-TCh mapping relationship for a single driving source signal and the n tester channels (e.g., DSS:TCh=1:n), in which the driving source signal can be provided to the n tester channels. The solution disclosed herein also supports an men DSS-to-TCh mapping relationship for m driving source signals and the n tester channels (e.g., DSS:TCh=m:n), in which the m driving source signals can be provided to the n tester channels. Thus, the solution disclosed herein may support a flexible DSS-to-TCh mapping relationship for the driving source signal(s) and the n tester channels, so that the test equipment may have more feasible configurations for the driving source signals and the tester channels. Thus, more test options can be provided by the test equipment when compared to the first and second existing control processes described above.

In the solution disclosed herein, only a selection command (e.g., a DUT selection (DSEL) command) from an ALPG instruction is used to implement the functionality disclosed herein, which is unlike the second existing control process in which various commands from the ALPG instruction are needed. Thus, the programming of ALPG instructions in this solution can be simpler. The size of each ALPG instruction can be reduced (e.g., with fewer command bits in the ALPG instruction), and execution of the instruction can be faster. Thus, a storage resource used to store the instructions and computational resources used to execute the instructions can be saved. For example, with less commands or instructions involved, less logic (or less circuit resource) is needed to implement the solution disclosed herein when compared with the second existing control process. The solution disclosed herein is more friendly to ALPG programing, where all driving source signals may come from ALPG instructions.

In the solution disclosed herein, only a bit map register is included in each tester channel, which is unlike the second existing control process in which various registers are included in each tester channel (e.g., as shown in FIG. 1 below). The bit map register disclosed herein may store a bit map associated with the tester channel. A selection of a bit control signal from the bit map can be determined based on a selection index stored in a selection register, and can be completed within a system cycle (e.g., with 200 MHZ). An output of the tester channel can be controlled by the bit control signal. Thus, this solution can provide a simple and straightforward approach to achieve independent control of each tester channel, and resources of the test equipment can be saved compared to the first and second existing control processes. Furthermore, the size of the bit map can be expanded to accommodate more DUTs, so that more DUTs can be multiplexed to each tester channel. Therefore, a utilization efficiency of the resources in the test equipment can be improved. Before performing test activities on the DUTs, the bit map in each tester channel can be initialized. The bit map can also be configured or updated based on an actual test need.

In the solution disclosed herein, a type of a driving source signal and a type of a timing format used to generate a waveform signal are not limited herein. For example, the solution disclosed herein supports any type of driving sources signals, any number of driving source signals, and any type of timing formats, which is different from the second existing control process in which the number of driving source signals and the number of timing formats are limited by the DSEL tables.

Consistent with some aspects of the present disclosure, the DSEL command may be included in an ALPG instruction (e.g., the DSEL command is part of the ALPG instruction). In some implementations, the ALPG instruction (including the DSEL command) may be generated by a pattern generation system (e.g., an ALPG). For example, the ALPG instruction (including the DSEL command) may be generated by a processor of the ALPG based on instructions stored in the ALPG. In another example, the ALPG instruction (including the DSEL command) may be generated by the processor of the ALPG based on user inputs provided to the ALPG. In still another example, the ALPG instruction (including the DSEL command) may be pre-programmed and pre-stored in the ALPG. In some implementations, the DSEL command may include data indicating a selected DUT. Thus, a selection index described below can be generated based on the DSEL command and used to select a bit control signal from a bit map, as described below in more detail.

FIG. 1 illustrates a schematic diagram of an exemplary control process 100 for controlling one or more tester channels multiplexed by a plurality of DUTs. Control process 100 may be implemented as an example of the second existing control process described above. FIG. 1 shows five DSEL tables 120 and two tester channels 104A and 104B included in a test equipment. Each DSEL table 120 may map an ALPG signal 122 to a timing format 124. Tester channel 104A may include DSEL table decode logic 106A, an AND gate 116A, and a multiplexer (MUX) 118A. Tester channel 104A may include various registers for storing a DSEL identifier (ID) 108A, a decode ID 110A, an enabled DSEL table ID 112A, and a disabled DSEL table ID 114A, respectively. Similarly, tester channel 104B may include DSEL table decode logic 106B, an AND gate 116B, and a MUX 118B. Tester channel 104B may also include various registers for storing a DSEL identifier (ID) 108B, a decode ID 110B, an enabled DSEL table ID 112B, and a disabled DSEL table ID 114B, respectively. An ALPG instruction 102 in control process 100 may include an address (ADDR) command in an ADDR field, a DSEL command in a DSEL field, and a DUT command in a DUT field.

Enabled DSEL table ID 112A and disabled DSEL table ID 114A of tester channel 104A may be sent to DSEL tables 120 to determine which DSEL table 120 is enabled and which DSEL table 120 is disabled for tester channel 104A, respectively. Alternatively or additionally, enabled DSEL table ID 112B and disabled DSEL table ID 114B of tester channel 104B may be sent to DSEL tables 120 to determine which DSEL table 120 is enabled and which DSEL table 120 is disabled for tester channel 104B, respectively. A waveform signal (e.g., an enable waveform) and/or a default output signal (e.g., a disable waveform) can be generated based on the DUT command in ALPG instruction 102 and DSEL tables 120. For example, the waveform signal can be generated based on an ALPG signal and a timing format in an enabled DSEL table 120. In another example, the default output signal can be generated based on the ALPG signal. The default output signal can be a deactivated signal to deactivate (or disable) a pin of a DUT when the pin receives the default output signal.

With respect to tester channel 104A, the DSEL command may be interpreted by tester channel 104A to generate an interpreted DSEL ID based on a socket file. The interpreted DSEL ID may be compared with DSEL ID 108A of tester channel 104A. If the interpreted DSEL ID is identical to DSEL ID 108A, an enabled (EN) signal can be generated and used as a first input to AND gate 116A. However, if the interpreted DSEL ID is not identical to DSEL ID 108A, a disabled signal can be generated and used as the first input to AND gate 116A.

The ADDR command may be interpreted by DSEL table decode logic 106A to obtain a decode address, and the decode address can be compared with decode ID 110A of tester channel 104A. If the decode address is identical to decode ID 110A, an enabled signal can be generated and used as a second input to AND gate 116A. However, if the decode address is not identical to decode ID 110A, a disabled signal can be generated and used as the second input to AND gate 116A.

An output of AND gate 116A can be used as a control signal of MUX 118A. The output of AND gate 116A can be generated based on the first input and the second input of AND gate 116A. For example, if both the first input and the second input are an enabled signal (e.g., a high-level signal), the output of AND gate 116A (the control signal of MUX 118A) can also be an enabled signal. In this case, MUX 118A may select the waveform signal as an output waveform to output through tester channel 104A. In another example, if at least one of the first input or the second input is a disabled signal (e.g., a low-level signal), the output of AND gate 116A (the control signal of MUX 118A) can also be a disabled signal. In this case, MUX 118A may select the default output signal as an output waveform to output through tester channel 104A.

With respect to tester channel 104B, similar operations can be performed such that the waveform signal or the default output signal can be selected by MUX 118B and outputted through tester channel 104B.

When a 1:n mapping relationship between the driving source signal and the tester channels (DSS:TCh=1:n) is applied, control process 100 may control the n tester channels independently. However, the implementation of control process 100 can be complicated. For example, complicated logic control is needed for waveform output, which may occupy a lot of logic resources in practice and cause difficulty on timing convergence in high frequency applications. For example, execution of control process 100 may be dependent on the ADDR field, the DUT field, and the DSEL field of ALPG instruction 102, which may add difficulty to the programming of ALPG instruction 102. Each tester channel may need to include various registers for storing a DSEL ID, a decode ID, an enabled table ID, and a disabled table ID, respectively. Therefore, a cost of each tester channel can be increased. Besides, a mapping between the tester channels and the driving source signals (as well as the timing formats) is dependent on a limited number of DSEL tables. As a result, only a part of driving source signals can be mapped to the tester channels, which is controlled by the DSEL command. Additionally, the implementation of control process 100 may also require at least the 5 software settings described above with respect to the second existing control process, which may add complexity to the application of control process 100.

Figure 2:
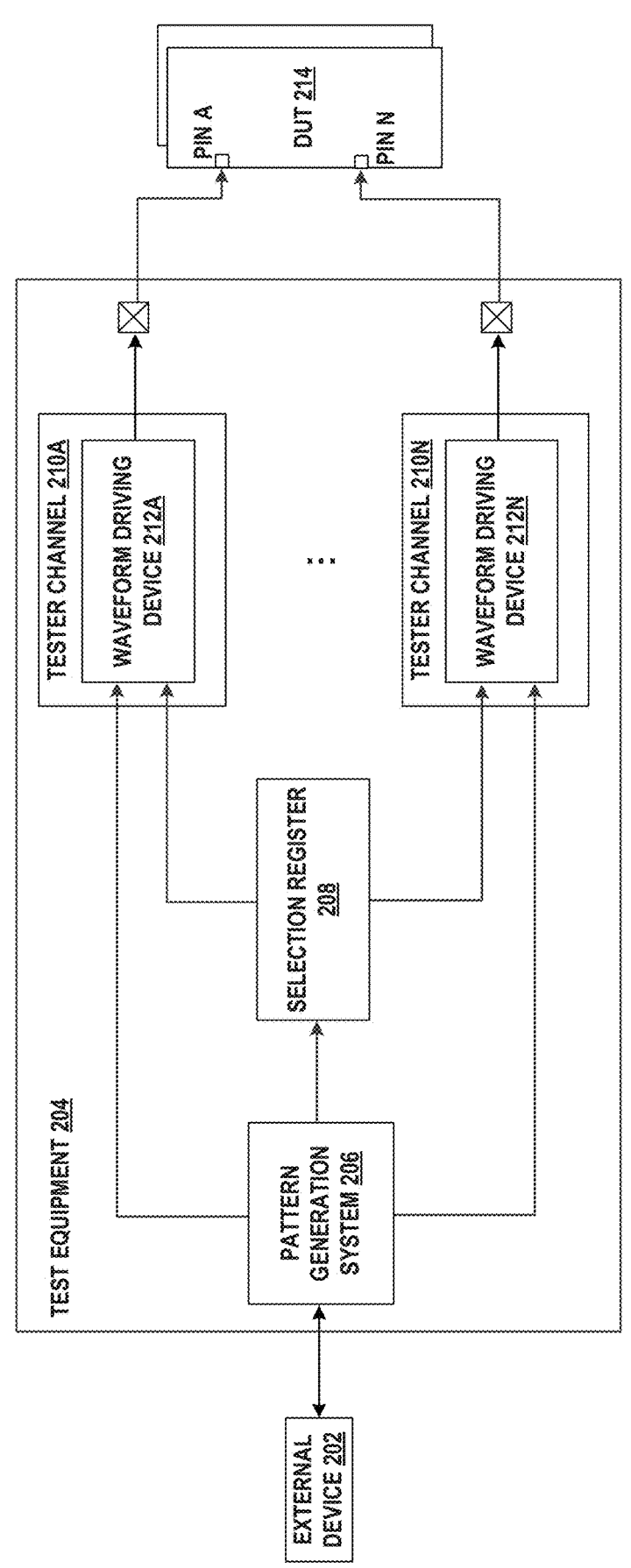
FIG. 2 illustrates a block diagram of an exemplary test environment including a test equipment and a plurality of DUTs, according to some aspects of the present disclosure.

FIG. 2 illustrates a block diagram of an exemplary test environment 200 including a test equipment 204 and a plurality of DUTs 214, according to some aspects of the present disclosure. In some implementations, test environment 200 may include an external device 202. External device 202 can be a server, a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. External device 202 can include a processor, a memory, and any other appropriate components for providing the functionality described herein.

Each DUT 214 can be a memory device (e.g., a three-dimensional (3D) NAND Flash memory device), an integrated circuit, or any other type of electronic device under test. For example, each DUT 214 can be an embedded Multi Media Card (eMMC), a solid-state drive (SSD), or any system product including an SSD. Each DUT 214 may include a set of pins including, for example, a pin A and a pin N shown in FIG. 2. Each of pins A and N can be a data (DQ) pin, a chip enable (CE) pin, a write enable (WE) pin, a read enable (RE) pin, or any other suitable pin of DUT 214.

Test equipment 204 can be an automatic test equipment (ATE), or any other integrated circuit (IC) tester for performing a test for DUTs 214. By way of examples, FIG. 2 shows that test equipment 204 is coupled to the plurality of DUTs 214 and configured to perform tests for the plurality of DUTs 214, respectively. In some implementations, the tests for the plurality of DUTs 214 can be performed simultaneously.

In some implementations, test equipment 204 may include a pattern generation system 206, a selection register 208, and a set of tester channels 210A, . . . , 210N including a set of waveform driving devices 212A, . . . , 212N, respectively. Tester channels 210A, . . . , 210N may be referred to as tester channel 210, collectively or individually. Waveform driving devices 212A, . . . , 212N may be referred to as waveform driving device 212, collectively or individually. Each tester channel 210 may include a waveform driving device 212.

In some implementations, each tester channel 210 may be multiplexed by the plurality of DUTs 214. Each tester channel 210 may be coupled to a plurality of pins from the plurality of DUTs 214, and configured to drive the plurality of pins to carry out test activities on the plurality of pins. For example, tester channel 210A (or waveform driving device 212A) is coupled to a plurality of pins A from the plurality of DUTs 214, and configured to drive the plurality of pins A. Tester channel 210N (or waveform driving device 212N) is coupled to a plurality of pins N from the plurality of DUTs 214, and configured to drive the plurality of pins N.

Pattern generation system 206 may be configured to generate a driving source signal based on an instruction (e.g., ALPG instruction). The driving source signal may include an address pattern, a data pattern, or a control pattern. Pattern generation system 206 may send the driving source signal to each tester channel 210. Pattern generation system 206 may also send a selection command (e.g., a DSEL command in a DSEL field) from the instruction to selection register 208. Pattern generation system 206 may be described below in more detail with reference to FIG. 3.

Selection register 208 may be controlled by the selection command. For example, selection register 208 may be configured to generate a selection index based on the selection command and store the selection index. The selection index may include an identifier (ID) for identifying a bit control signal in a bit map, which is described below in more detail. Selection register 208 may provide the selection index to each tester channel 210 coupled to selection register 208.

Selection register 208 may be configured to perform one or more operations to update the selection index based on the selection command. For example, based on the selection command, selection register 208 may increase the value of the selection index by adding 1 or another positive integer to the value of the selection index. In another example, selection register 208 may decrease the value of the selection index by subtracting 1 or another positive integer from the value of the selection index. The updated value of the selection index may be effective and used in the next instruction cycle after the selection command is executed.

In some implementations, selection register 208 may optionally generate a select-all signal based on the selection command. The select-all signal may indicate that all tester channels 210 (equivalently, all waveform driving devices 212) coupled to selection register 208 are enabled (selected) to output corresponding waveform signals, respectively. The select-all signal may include an enabled signal (e.g., a high-level signal) which can be provided to each tester channel 210 coupled to selection register 208.

The set of waveform driving devices 212 in the set of tester channels 210 may be coupled to selection register 208 and pattern generation system 206, respectively. The set of waveform driving devices 212 may be configured to generate a set of waveform signals for the set of tester channels 210 based on the driving source signal, respectively. The set of waveform driving devices 212 may be configured to control an output of the set of waveform signals through the set of tester channels 210 based on the selection index and a set of bit maps associated with the set of tester channels 210. Alternatively, the set of waveform driving devices 212 may be configured to control an output of the set of waveform signals through the set of tester channels 210 based on the select-all signal. Tester channel 210, waveform driving device 212, and the bit map are described below in more detail with reference to FIGS. 4-5.

Figure 3:
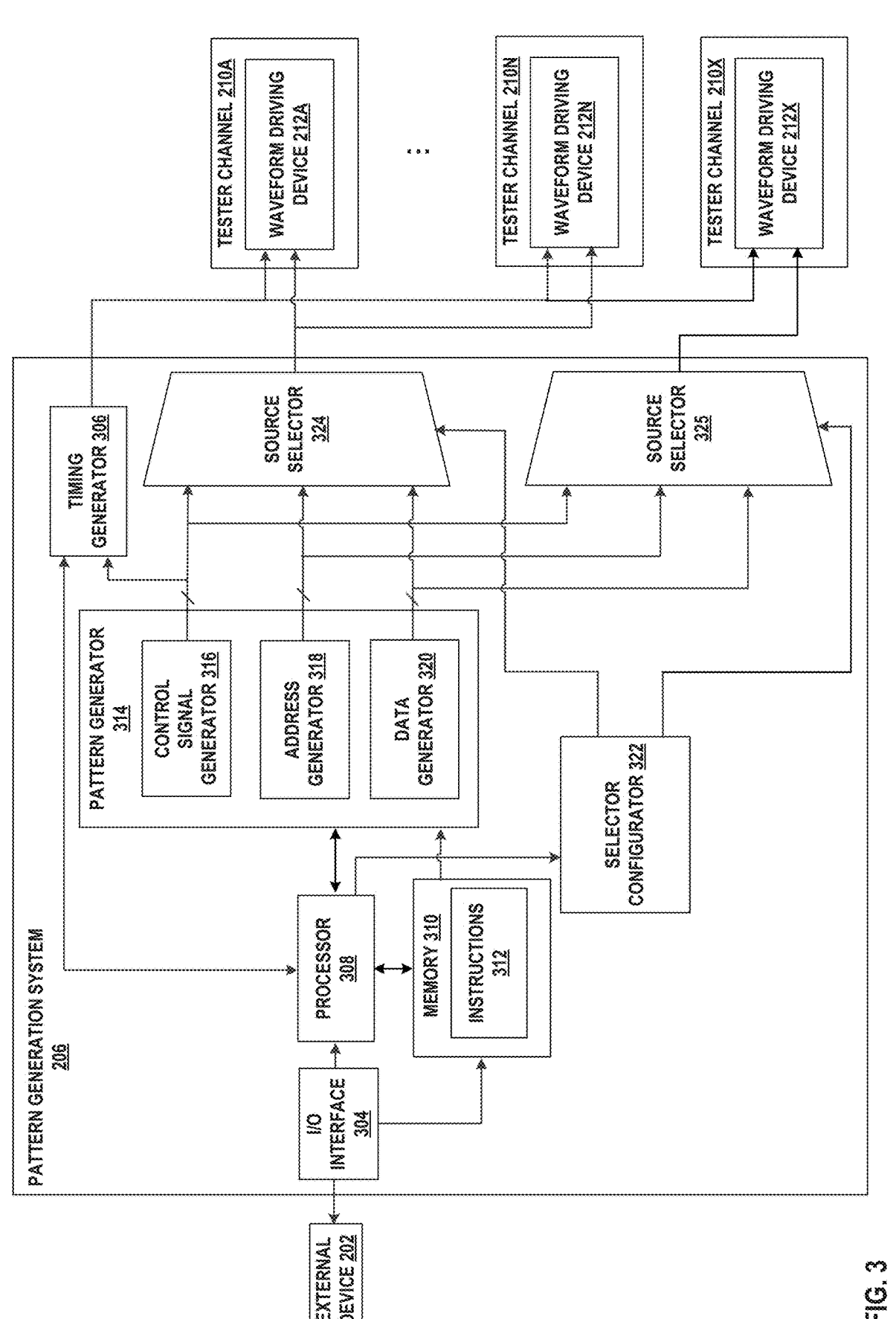
FIG. 3 illustrates a block diagram of an exemplary pattern generation system in the test equipment of FIG. 2, according to some aspects of the present disclosure.

FIG. 3 illustrates a block diagram of an exemplary pattern generation system (e.g., pattern generation system 206) in test equipment 204 of FIG. 2, according to some aspects of the present disclosure. Pattern generation system 206 may include an input/output (I/O) interface 304, a timing generator 306, a processor 308, a memory 310, a pattern generator 314, a selector configurator 322, and a source selector 324. In some implementations, pattern generation system 206 may optionally include a source selector 325.

I/O interface 304 may be an interface that couples pattern generation system 206 to external device 202. For example, I/O interface 304 may include one or more of a network interface, a universal serial bus (USB), a parallel bus interface (PBI), a thunderbolt, or any other suitable type of interface for outputting or receiving data to or from external device 202. In some implementations, I/O interface 304 can receive data from external device 202 and send the data to one or more components of pattern generation system 206. For example, I/O interface 304 receives instructions or codes from external device 202, and stores the instructions or codes in memory 310.

Processor 308 can be any suitable type of processors, for example, a central processing unit (CPU), a microprocessor, a system-on-chip (SoC), or an application processor (AP), etc. Processor 308 may include various computing architectures including a complex instruction set computer (CISC) architecture, a reduced instruction set computer (RISC) architecture, or an architecture implementing a combination of instruction sets. Although only a single processor is shown in FIG. 3, multiple processors may be included. Processor 308 can be configured to send or receive data to or from memory 310. For example, processor 308 can be configured to receive instructions from memory 310 and execute the instructions to provide the functionality described herein.

Memory 310 stores data that may include code or routines for performing part of or all of the techniques described herein. For example, memory 310 may store instructions 312 (e.g., ALPG instructions). Memory 310 may be a dynamic random access memory (DRAM) device, a static random access memory (SRAM) device, a hard disk drive, a floppy disk drive, a CD-ROM device, a DVD-ROM device, a DVD-RAM device, a DVD-RW device, a flash memory device (e.g., NAND Flash memory device), or some other suitable memory device. In some implementations, memory 310 may be included in processor 308. For example, processor 308 may be implemented using a field-programmable logic array (FPGA), and memory 310 can be a memory included in the FPGA.

Pattern generator 314 may be coupled to I/O interface 304, timing generator 306, processor 308, memory 310, selector configurator 322, and source selector 324, respectively. Pattern generator 314 can be configured to generate a plurality of source patterns based on instructions 312 stored in memory 310. In some implementations, pattern generator 314 includes a programmable logic device (PLD) (e.g., an FPGA) that is configured to provide the functionality described herein. In some implementations, in response to the execution of instructions 312 or other data stored in memory 310, processor 308 can be configured to implement the functionality of pattern generator 314.

In some implementations, pattern generator 314 can include a control signal generator 316, an address generator 318, and a data generator 320. The plurality of source patterns generated by pattern generator 314 can include a control pattern generated by control signal generator 316, an address pattern generated by address generator 318, and a data pattern generated by data generator 320. The plurality of source patterns can be supplied to source selector 324.

In some implementations, control signal generator 316 may include a controller configured to generate the control pattern. Control signal generator 316 can retrieve an instruction from memory 310, generate the control pattern based on the instruction, and output the control pattern to source selector 324. The control pattern may include a set of control signals. For example, the control pattern may include data describing a set of commands for performing different operations.

In some implementations, address generator 318 may include an address arithmetic logic unit (ALU) configured to generate an address pattern. Address generator 318 can retrieve an instruction from memory 310, generate the address pattern based on the instruction, and output the address pattern to source selector 324. The address pattern may include data describing an address of a memory device. For example, the address pattern includes address data of a NAND Flash memory device embedded in DUT 214.

In some implementations, data generator 320 can retrieve an instruction from memory 310, generate a data pattern based on the instruction, and output the data pattern to source selector 324. The data pattern may include, for example, data to be executed on by an operation, data to be written to an address of a memory device embedded in a DUT 214, or any other suitable data for performing a test for a DUT 214.

Timing generator 306 can be coupled to control signal generator 316 and the set of tester channels 210, respectively. Timing generator 306 may be configured to generate one or more timing formats and provide the one or more timing formats to the set of tester channels 210 in test equipment 204. In some implementations, timing generator 306 may include a RAM configured to store a timing format lookup table. The timing format lookup table may be used to store various timing formats, for example, including the one or more timing formats generated by timing generator 306. The timing formats may include, for example, 0 edge, 1 edge, 2 edges, return to one (RTO), return to zero (RTZ), not return to zero (NRZ), STROBE position, etc. In some implementations, timing generator 306 may receive one or more control signals from control signal generator 316 and generate one or more timing formats based on the one or more control signals. In some implementations, timing generator 306 may provide the same timing format different tester channels 210. In some implementations, timing generator 306 may provide different timing formats to different tester channels 210.

Figure 4A:
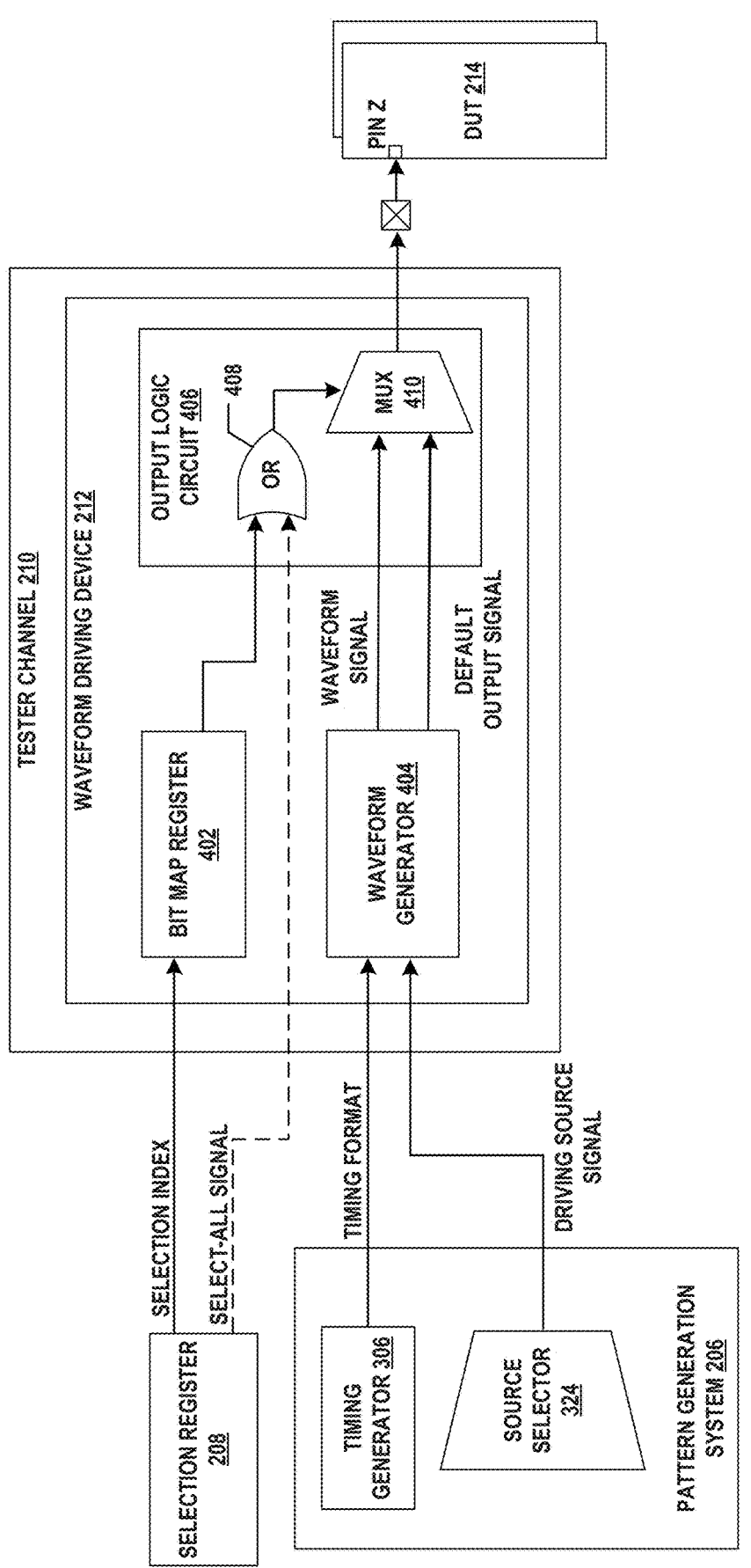
FIG. 4A illustrates a block diagram of an exemplary tester channel having a waveform driving device in the test equipment of FIG. 2, according to some aspects of the present disclosure.
Figure 4B:
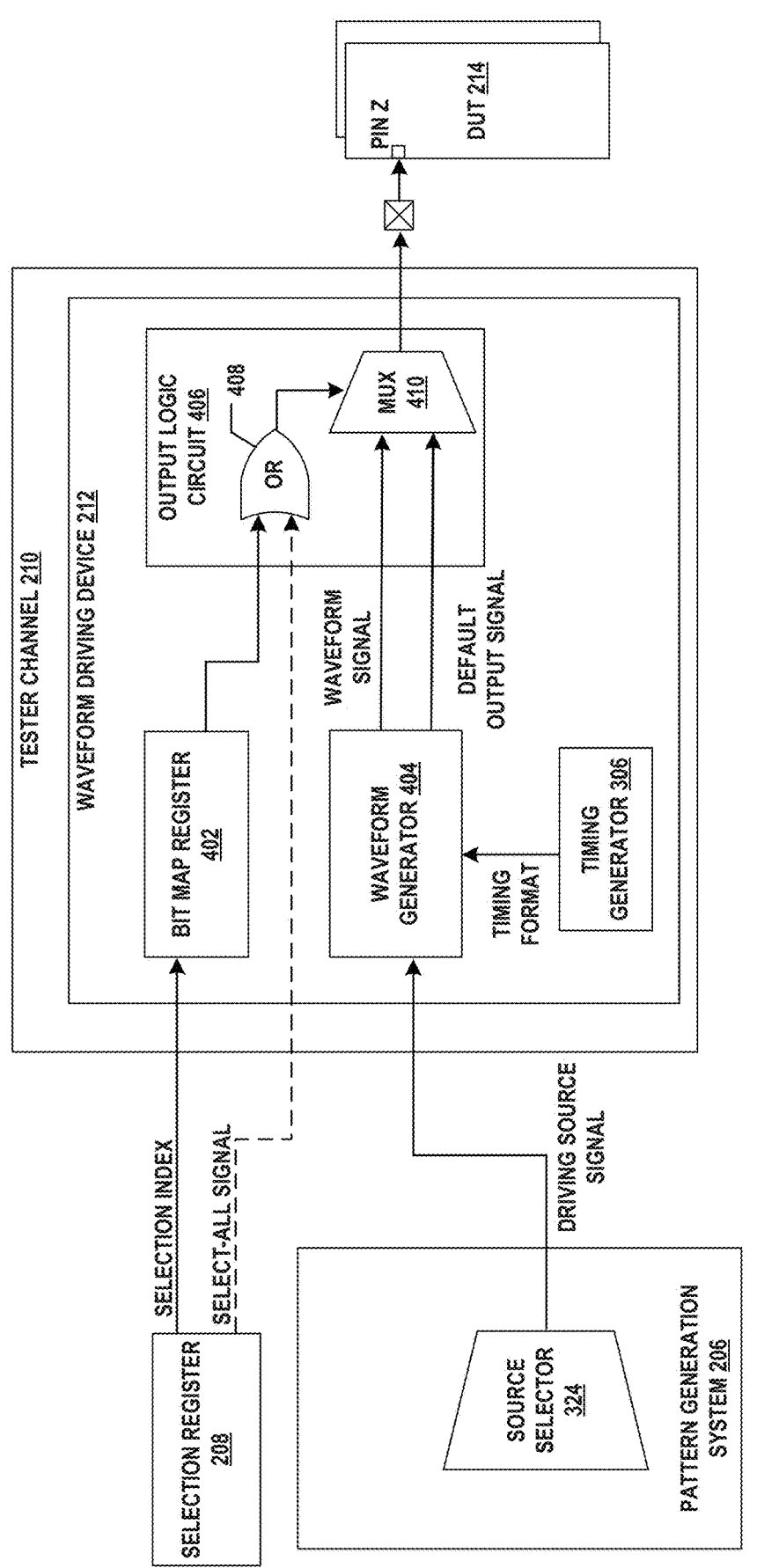
FIG. 4B illustrates a block diagram of another exemplary tester channel having a waveform driving device in the test equipment of FIG. 2, according to some aspects of the present disclosure.

In some implementations, timing generator 306 may be shared by the set of tester channels 210 (e.g., as shown in FIG. 3 or 4A). For example, timing generator 306 may provide timing formats to each of the tester channel 210. In some implementations, each tester channel 210 may include its own timing generator for the generation of its timing formats (e.g., as shown in FIG. 4B). For example, each tester channel 210 may include a separate timing generator 306.

Selector configurator 322 may be coupled to I/O interface 304, processor 308, memory 310, pattern generator 314, and source selector 324, respectively. In some implementations, selector configurator 322 can be implemented using a programmable logic device such as an FPGA that is configured to provide the functionality described herein. In some implementations, in response to the execution of instructions 312 or other data stored in memory 310, processor 308 can be configured to implement the functionality of selector configurator 322.

Selector configurator 322 can be configured to control mapping between a plurality of inputs of source selector 324 and an output of source selector 324. For example, selector configurator 322 can retrieve instruction 312 from memory 310 and generate a source selection signal for source selector 324 based on instruction 312, so that source selector 324 may select one of the plurality of source patterns as an output based on the source selection signal.

Source selector 324 may be coupled to I/O interface 304, processor 308, memory 310, pattern generator 314, selector configurator 322, and the set of tester channels 210A, 210N, respectively. In some implementations, source selector 324 may be a pin scrambler. Source selector 324 may include one or more MUXs. Source selector 324 may receive a plurality of source patterns from pattern generator 314 and a source selection signal from selector configurator 322. Source selector 324 may multiplex the plurality of source patterns to generate an output based on the source selection signal. For example, source selector 324 may select one of the plurality of source patterns as an output based on the source selection signal. The output of source selector 324 may be referred to as a driving source signal for the set of waveform driving devices 212A, . . . , 212N coupled to source selector 324. The driving source signal may include a data pattern, a control pattern, or an address pattern.

In some implementations, pattern generation system 206 may further include one or more additional source selectors, so that one or more additional driving source signals can be outputted from the one or more additional source selectors, respectively, and provided to other tester channels 210. For example, pattern generator system 206 may further include source selector 325, which is coupled to selector configurator 322, pattern generator 314, and a tester channel 210X, respectively. Tester channel 210X may include a waveform driving device 212X. Selector configurator 322 can be configured to control mapping between a plurality of inputs of source selector 325 and an output of source selector 325 by generating and providing a corresponding source selection signal to source selector 325. Source selector 325 may receive a plurality of source patterns from pattern generator 314 and the corresponding source selection signal from selector configurator 322. Source selector 325 may select one of the plurality of source patterns as an output based on the corresponding source selection signal. The output of source selector 325 may be referred to as a driving source signal for waveform driving device 212X coupled to source selector 325. Waveform driving device 212X may also receive a timing format from timing generator 306.

FIG. 4A illustrates a block diagram of an exemplary tester channel (e.g., tester channel 210) having a waveform driving device (e.g., waveform driving device 212) in test equipment 204 of FIG. 2, according to some aspects of the present disclosure. Waveform driving device 212 may include a bit map register 402, a waveform generator 404, and an output logic circuit 406. In some implementations, tester channel 210 may be multiplexed by a plurality of DUTs 214, such that waveform driving device 212 in tester channel 210 may be coupled to and configured to drive a plurality of pins Z from the plurality of DUTs 214, respectively.

Waveform generator 404 may receive a driving source signal from source selector 324 coupled to waveform driving device 212, and receive a timing format from timing generator 306 coupled to waveform driving device 212. Waveform generator 404 may be configured to generate a waveform signal based on the driving source signal and the timing format. In some implementations, waveform generator 404 may also generate a default output signal. The default output signal may be a deactivated signal. If the default output signal is provided to a pin of a DUT 214, it indicates that the pin of DUT 214 is not tested. In some implementations, waveform generator 404 includes an FPGA configured to provide the functionality described herein.

Bit map register 402 may be configured to store a bit map associated with tester channel 210. The bit map can be used to control an output behavior of tester channel 210. For example, the bit map may be used to control an output of the waveform signal to the plurality of pins Z through tester channel 210. Specifically, the bit map may include a plurality of bit control signals. A total number of the plurality of bit control signals in the bit map (e.g., a size of the bit map) may be set based on a total number of the plurality of DUTs 214 coupled to tester channel 210. For example, the total number of the plurality of bit control signals in the bit map may be equal to the total number of the plurality of DUTs 214 coupled to tester channel 210. The size of the bit map can be adjustable according to the number of the plurality of DUTs 214 coupled to tester channel 210. Each bit control signal may be an enabled signal (e.g., a high-level signal, or "1") or a disabled signal (e.g., a low-level signal, or "0").

Each bit control signal in the bit map may correspond to a tester channel from a plurality of tester channels, and may be used to control an output of the waveform signal to the plurality of pins Z through tester channel 210 when the DUT is selected by a selection index from selection register 208. For example, bit map register 402 may select a bit control signal corresponding to a DUT from the bit map based on the selection index from selection register 208. If the selected bit control signal is an enabled signal, the waveform signal can be outputted to the plurality of pins Z through tester channel 210. Alternatively, if the selected bit control signal is a disabled signal, the waveform signal may be inhibited from outputting to the plurality of pins Z through tester channel 210. In some implementations, the plurality of DUTs 214 may be controlled independently based on the bit control signals in the bit map. In some implementations, the plurality of pins Z from the plurality of DUTs 214 may be controlled independently based on the bit control signals in the bit map.

In some implementations, the bit map for tester channel 210 can be configured flexibly based on actual needs through a software setting or a user configuration. For example, values for the bit control signals in the bit map can be configured based on a connection relationship between different tester channels 210 and the plurality of DUTs 214, a test type performed to the plurality of DUTs 214, an actual test requirement of the plurality of DUTs 214, test behaviors performed on the plurality of DUTs 214, etc. In some implementations, the values for the bit control signals in the bit map can be modified via an application programming interface (API) of a software setting, so that an output behavior of tester channel 210 can be modified accordingly.

Output logic circuit 406 may be coupled to bit map register 402 and waveform generator 404, respectively. Output logic circuit 406 may be configured to control an output of the waveform signal through tester channel 210 based on a bit control signal selected from the bit map or a select-all signal received from selection register 208. For example, responsive to the bit control signal being an enabled signal, output logic circuit 406 may be configured to output the waveform signal to the plurality of pins Z through tester channel 210. Alternatively, responsive to the bit control signal being a disabled signal, output logic circuit 406 may be configured to inhibit the waveform signal from outputting to the plurality of pins Z through tester channel 210. In another example, if the select-all signal is received from selection register 208, output logic circuit 406 may be configured to output the waveform signal to the plurality of pins Z through tester channel 210. In some implementations, the waveform signal outputted by output logic circuit 406 responsive to the bit control signal being an enabled signal and the waveform signal outputted by output logic circuit 406 responsive to receiving the select-all signal can be identical to or different from one another, which depends on how the waveform signal is generated by waveform generator 404 responsive to the bit control signal being the enabled signal or responsive to receiving the select-all signal.

In some implementations, output logic circuit 406 may be implemented using a programmable logic device (PLD) (e.g., an FPGA) that is configured to provide the functionality described herein. In some implementations, output logic circuit 406 may be implemented using an application specific integrated circuit (ASIC).

In some implementations, output logic circuit 406 may include an OR gate 408 and a MUX 410. OR gate 408 may be coupled to bit map register 402 to receive the bit control signal selected from the bit map. In some implementations, OR gate 408 may also receive the select-all signal from selection register 208. OR gate 408 may be configured to generate an OR output based on at least one of the bit control signal or the select-all signal. For example, if the select-all signal is received from selection register 208 indicative of a selection of tester channel 210 (or a selection of waveform driving device 212) to output the waveform signal, OR gate 408 may generate and output an enabled signal to MUX 410. In another example, if the bit control signal selected from the bit map is an enabled signal ("1"), OR gate 408 may output the enabled signal ("1") to MUX 410. In still another example, if the select-all signal is not received and the bit control signal is a disabled signal ("0"), OR gate 408 may output a disabled signal ("0") to MUX 410.

MUX 410 may be coupled to OR gate 408 and waveform generator 404 to receive the OR output and the waveform signal, respectively, and configured to control the output of the waveform signal through tester channel 210 based on the OR output. Specifically, responsive to the OR output being an enabled signal, MUX 410 may output the waveform signal to the plurality of pins Z through tester channel 210. Responsive to the OR output being a disabled signal, MUX 410 may output a default output signal to the plurality of pins Z through tester channel 210. In this case, the waveform signal is not outputted to the plurality of pins Z.

For example, the plurality of pins Z can be a plurality of CE pins from the plurality of DUTs 214, which are activated by a low-level signal. The waveform signal can be a low-level signal with the timing format, and the default output signal can be a high-level signal. Responsive to the OR output being an enabled signal, MUX 410 may output the low-level signal with the timing format to the plurality of pins Z through tester channel 210, so that the plurality of pins Z are activated by the low-level signal. However, responsive to the OR output being a disabled signal, MUX 410 may output the high-level signal to the plurality of pins Z through tester channel 210, so that the plurality of pins Z are deactivated by the high-level signal.

It is noted that the driving source signal and the timing format provided to waveform generator 404 can be any driving source signal and any timing format, respectively, and are not limited to any particular forms. This is different from control process 100 of FIG. 1, in which the driving source signal and the timing format are limited by DSEL tables 120. Thus, waveform driving device 212 disclosed herein may have higher flexibility to generate any suitable type of waveform signals.

FIG. 4B illustrates a block diagram of another exemplary tester channel having a waveform driving device (e.g., waveform driving device 212) in test equipment 200 of FIG. 2, according to some aspects of the present disclosure. In FIG. 4B, tester channel 210 may include its own timing generator 306 for the generation of the timing format. FIG. 4B may include components like those described above for FIG. 4A, and the similar description will not be repeated here.

Figure 5:
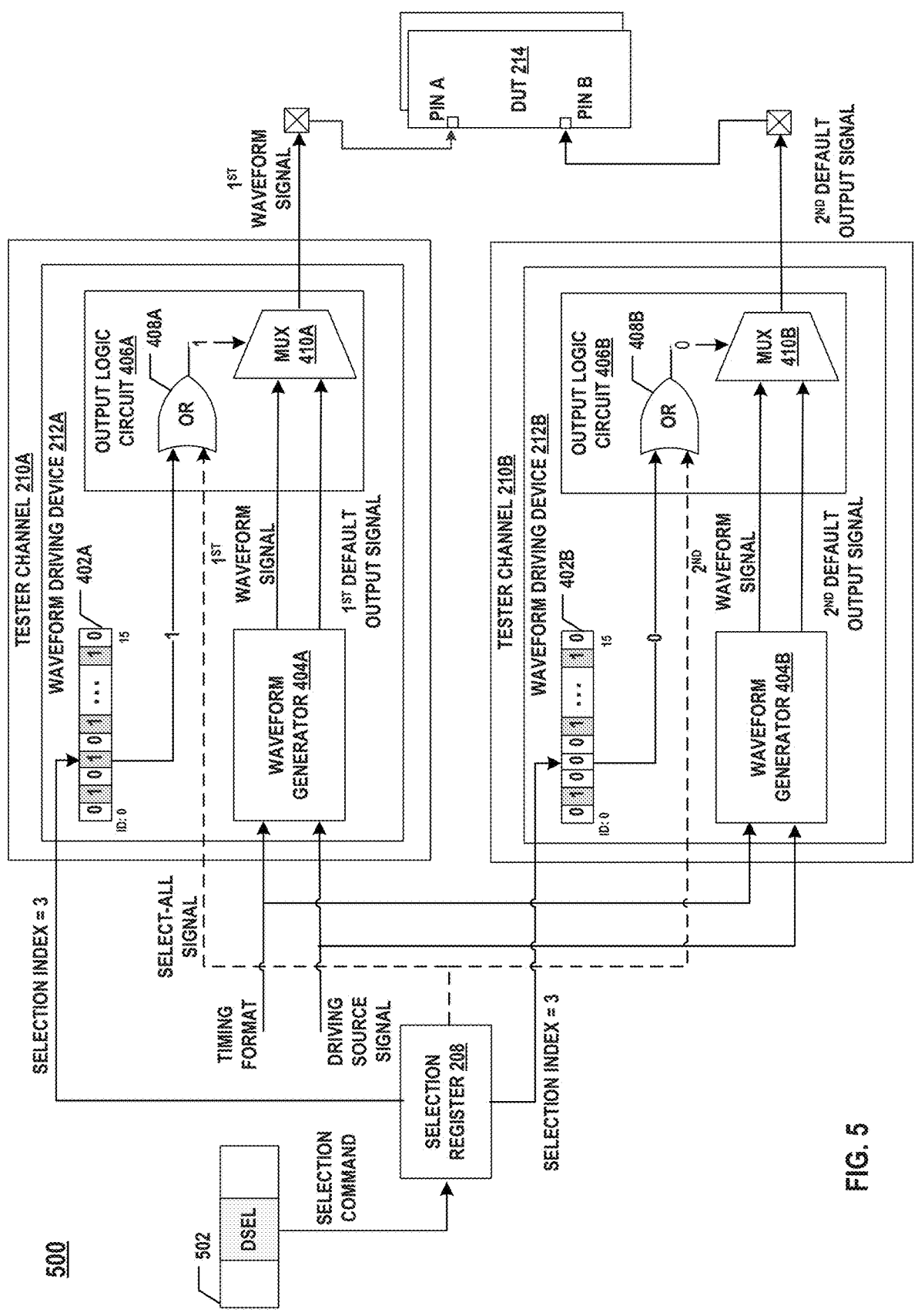
FIG. 5 illustrates a schematic diagram of an exemplary control process for controlling one or more tester channels multiplexed by a plurality of DUTs, according to some aspects of the present disclosure.

FIG. 5 illustrates a schematic diagram of an exemplary control process 500 for controlling one or more tester channels 210 multiplexed by a plurality of DUTs 214, according to some aspects of the present disclosure. The one or more tester channels 210 may be coupled to the plurality of DUTs 214 (e.g., 16 DUTs), such that each tester channel 210 may be multiplexed by the plurality of DUTs 214. The one or more tester channels 210 may include tester channel 210A and a tester channel 210B.

Tester channel 210A may include waveform driving device 212A. Waveform driving device 212A may be configured to drive a plurality of pins A from the plurality of DUTs 214, respectively. Waveform driving device 212A includes a bit map register 402A for storing a first bit map, a waveform generator 404A, and an output logic circuit 406A. Output logic circuit 406A may include an OR gate 408A and a MUX 410A. The first bit map may include 16 bit control signals, identified by IDs from 0 to 15, respectively. Similarly, tester channel 210B may include a waveform driving device 212B. Waveform driving device 212B may be configured to drive a plurality of pins B from the plurality of DUTs 214, respectively. Waveform driving device 212B includes a bit map register 402B for storing a second bit map, a waveform generator 404B, and an output logic circuit 406B. Output logic circuit 406B may include an OR gate 408B and a MUX 410B. The second bit map may also include 16 bit control signals, identified by IDs from 0 to 15, respectively.

In some implementations, selection register 208 may receive a selection command from an instruction 502 and generate (or update) a selection index based on the selection command. Since the size of the first or second bit map is 16, a value range of the selection index can be between 0 and 15 (e.g., 0≤selection index≤15). By way of examples, assuming that the generated (or updated) selection index may have a value of 3 (e.g., selection index=3). Selection register 208 may send the selection index to bit map register 402A of waveform driving device 212A and bit map register 402B of waveform driving device 212B, respectively. Timing generator 306 may send a timing format to waveform generator 404A of waveform driving device 212A and waveform generator 404B of waveform driving device 212B, respectively. Similarly, source selector 324 may send a driving source signal to waveform generator 404A and waveform generator 404B, respectively.

With respect to tester channel 210A, waveform generator 404A may generate a first waveform signal based on the timing format and the driving source signal. For example, the driving source signal may include one of an address pattern, a data pattern, or a control pattern used to test the plurality of pins A from the plurality of DUTs 214. Waveform generator 404A may generate the first waveform signal that carries information of the address pattern, the data pattern, or the control pattern with a format of RTO, RTZ, NRZ, or another format indicated by the timing format. Waveform generator 404A may also generate a first default output signal. In some implementations, the generation of the first default output signal may not depend on the timing format. The first default output signal may be generated or selected based on the driving source signal. For example, various default output signals may be pre-programmed or pre-stored in waveform driving device 212A, and the first default output signal can be selected from the various default output signals based on the driving source signal. The first waveform signal and the first default output signal may be inputted to MUX 410A. Bit map register 402A may output a bit control signal corresponding to ID=3 based on the selection index (selection index=3). In this example, the bit control signal corresponding to ID=3 is an enabled signal ("1"). The bit control signal may be inputted to OR gate 408A, causing OR gate 408A to output an OR output of "1." Based on the OR output of "1", MUX 410A may select the first waveform signal to output to the plurality of pins A through tester channel 210A. That is, tester channel 210A (or waveform driving device 212A) is enabled (or selected) to output the first waveform signal to the plurality of pins A.

With respect to tester channel 210B, waveform generator 404B may generate a second waveform signal based on the timing format and the driving source signal. Waveform generator 404B may also generate a second default output signal. The second waveform signal and the second default output signal may be inputted to MUX 410B. Bit map register 402B may output a bit control signal corresponding to ID=3 based on the selection index (selection index=3). In this example, the bit control signal corresponding to ID=3 is a disabled signal ("0"). The bit control signal may be inputted to OR gate 408B, causing OR gate 408B to output an OR output of "0." Based on the OR output of "0", MUX 410B may select the second default output signal to output to the plurality of pins B through tester channel 210B. That is, tester channel 210B (or waveform driving device 212B) is disabled (or not selected) to output the second waveform signal to the plurality of pins B.

As a result, an output control of tester channel 210A can be independent from an output control of tester channel 210B. For example, an output control of the first waveform signal through tester channel 210A can be independent from an output control of the second waveform signal through tester channel 210B.

In some implementations, selection register 208 may optionally provide a select-all signal to OR gates 408A and 408B, respectively. In this case, both OR gates 408A and 408B may generate an OR output of "1", respectively. MUX 410A may select the first waveform signal to output to the plurality of pins A through tester channel 210A. MUX 410B may select the second waveform signal to output to the plurality of pins B through tester channel 210B. That is, tester channel 210A (or waveform driving device 212A) is enabled (or selected) to output the first waveform signal to the plurality of pins A; and simultaneously, tester channel 210B (or waveform driving device 212B) is enabled (or selected) to output the second waveform signal to the plurality of pins B.

It is noted that even if tester channels 210A and 210B are enabled (or selected) to output waveform signals simultaneously, the waveform signals outputted through tester channels 210A and 210B can be different because each tester channel 210A or 210B has its own waveform driving device to generate its own waveform signal. For example, the first waveform signal from tester channel 210A can be different from the second waveform signal from tester channel 210B. This is different from control process 100 of FIG. 1, in which the same waveform signal is generated and outputted to all the enabled (or selected) tester channels simultaneously because each tester channel in FIG. 1 does not generate its own waveform signal. Thus, test equipment 204 disclosed herein may perform test activities with higher flexibility than that of control process 100 in FIG. 1 by providing diverse waveform signals for the test activities.

FIG. 6 illustrates a graphical representation of an exemplary comparison among different control processes for controlling one or more tester channels, according to some aspects of the present disclosure. Tables 1, 2, and 3 show control of tester channels TCh_0, TCh_1, TCh_2, . . . , TCh_n-1 that are provided with the same driving source signal, with respect to the first existing control process, the second existing control process (e.g., control process 100 of FIG. 1), and control process 500 of FIG. 5, respectively. That is, a 1:n DSS-to-TCh mapping relationship (DSS:TCh=1:n) is set between the driving source signal and the tester channels for each of Tables 1-3.

With respect to Table 1, DURCTRL bits in an ALPG instruction can be configured to control enablement or disablement of all the tester channels TCh_0, TCh_1, TCh_2, . . . , TCh_n-1 simultaneously in the first existing control process. For example, by configuring the DURC-TRL bits in the ALPG instruction, all tester channels TCh_0, TCh_1, TCh_2, . . . , TCh_n-1 can be enabled to output waveform signals simultaneously (e.g., as shown in Table 1 in which driving enablement of each tester channel is "1"). Alternatively, by configuring the DURCTRL bits in the ALPG instruction, all tester channels TCh_0, TCh_1, TCh_2, . . . , TCh_n-1 can be disabled simultaneously, so that no waveform signals (except default output signals) are outputted through the tester channels TCh_0, TCh_1, TCh_2, . . . , TCh_n-1. As a result, the first existing control process fails to control each of the tester channels TCh_0, TCh_1, TCh_2, . . . , TCh_n-1 independently when DSS: TCh=1:n.

With respect to Table 2, a complicate DSEL table decode logic (e.g., 106A or 106B of FIG. 1), as well as a DSEL command and an address command from an ALPG instruction, is needed to control enablement or a disablement of each tester channel TCh_0, TCh_1, TCh_2, . . . , or TCh_n-1 in the second existing control process. At least one of a waveform signal or a default output signal can be generated based on the driving source signal. The DSEL table decode logic may decode the address command to generate a decode address (e.g., assuming that the decode address=2 by ways of examples). An interpreted DSEL ID can be obtained from the DUT command (e.g., assuming that the interpreted DSEL ID=3 by way of examples). Decode IDs and DSEL IDs of the tester channels TCh_0, TCh_1, TCh_2, . . . , TCh_n-1 are listed in Table 2, respectively.

For each tester channel, a decode ID of the tester channel is compared to the decode address, and a DSEL ID of the tester channel is also compared to the interpreted DSEL ID. If the decode ID of the tester channel is equal to the decode address, and the DSEL ID of the tester channel is equal to the interpreted DSEL ID, the tester channel can be enabled to output the waveform signal. Otherwise, the tester channel can be disabled (e.g., a default output signal can be outputted from the tester channel). For example, as shown in Table 2, the decode IDs and the DSEL IDs of the tester channels TCh_2 and TCh_n-2 are equal to the decode address and the interpreted DSEL ID, respectively. The tester channels TCh_2 and TCh_n-2 can be enabled to output the waveform signal, respectively (e.g., as shown in Table 2 in which a driving enablement of the tester channel TCh_2 or TCh_n-2 is "1"). The remaining tester channels can be disabled (e.g., as shown in Table 2 in which a driving enablement of each of the remaining tester channels is "0").

As described above, the implementation of the second existing approach can be complicated (e.g., with complicated hardware implementations and complicated software settings). The number of waveform signals generated and managed by the second existing control process is limited. Besides, control of the tester channels in the second approach not only depends on the DSEL command, but also depends on other commands in the ALPG instruction, such as the address command and a DUT command. This may add complexity to the application of the second existing control process. Additionally, each of the enabled tester channels can only output the same waveform signal simultaneously, which may limit the test performance of the test equipment when compared to control process 500 of FIG. 5 where different waveform signals can be outputted from different enabled tester channels.

With respect to Table 3, control process 500 disclosed herein may determine a selection index based on a selection command (e.g., a DSEL command). By way of examples, assuming that the selection index is equal to 3 (e.g., selection index=3). Bit maps for the tester channels TCh_0, TCh_1, TCh_2, . . . , TCh_n-1 are listed in Table 3, respectively. IDs for bit control signals in each bit map are 0, 1, 2, 3, . . . , 15 from right to left (e.g., assuming that there are 16 DUTs). For example, with respect to the tester channel TCh_0, bit control signals for IDs=0, 1, 2, 3, . . . , 13, 14, and 15 in the bit map are "1", "0", "1", "1", . . . , "1, "0", and "1", respectively. Control process 500 may generate waveform signals for the tester channels TCh_0, TCh_1, TCh_2, . . . , TCh_n-1, respectively. For example, a first waveform signal and a second waveform signal are generated for the tester channels TCh_0 and TCh_2, respectively.

For each tester channel, control process 500 may determine a bit control signal for the tester channel based on a bit map of the tester channel and the selection index. Control process 500 may determine whether to enable or disable the tester channel to output a corresponding waveform signal based on the bit control signal of the tester channel. For example, for each of the tester channels TCh_0 and TCh_2, a bit control signal corresponding to the selection index (selection index=3) is "1." The tester channels TCh_0 and TCh_2 can be enabled to output the first waveform signal and the second waveform signal, simultaneously. The remaining tester channels are disabled (e.g., as shown in Table 3 in which driving enablement of each of the remaining tester channels is "0").

Compared with the second existing approach, an implementation of control process 500 disclosed herein is relatively simple (e.g., as shown in FIGS. 2-5). Unlike the second existing approach that needs several commands in an ALPG instruction, a DSEL command in the ALPG instruction is used to achieve independent control of each tester channel when DSS:TCh=1:n in the disclosure provided herein. Thus, the programming of the ALPG instructions can be simplified and more user-friendly.

Figure 7A:
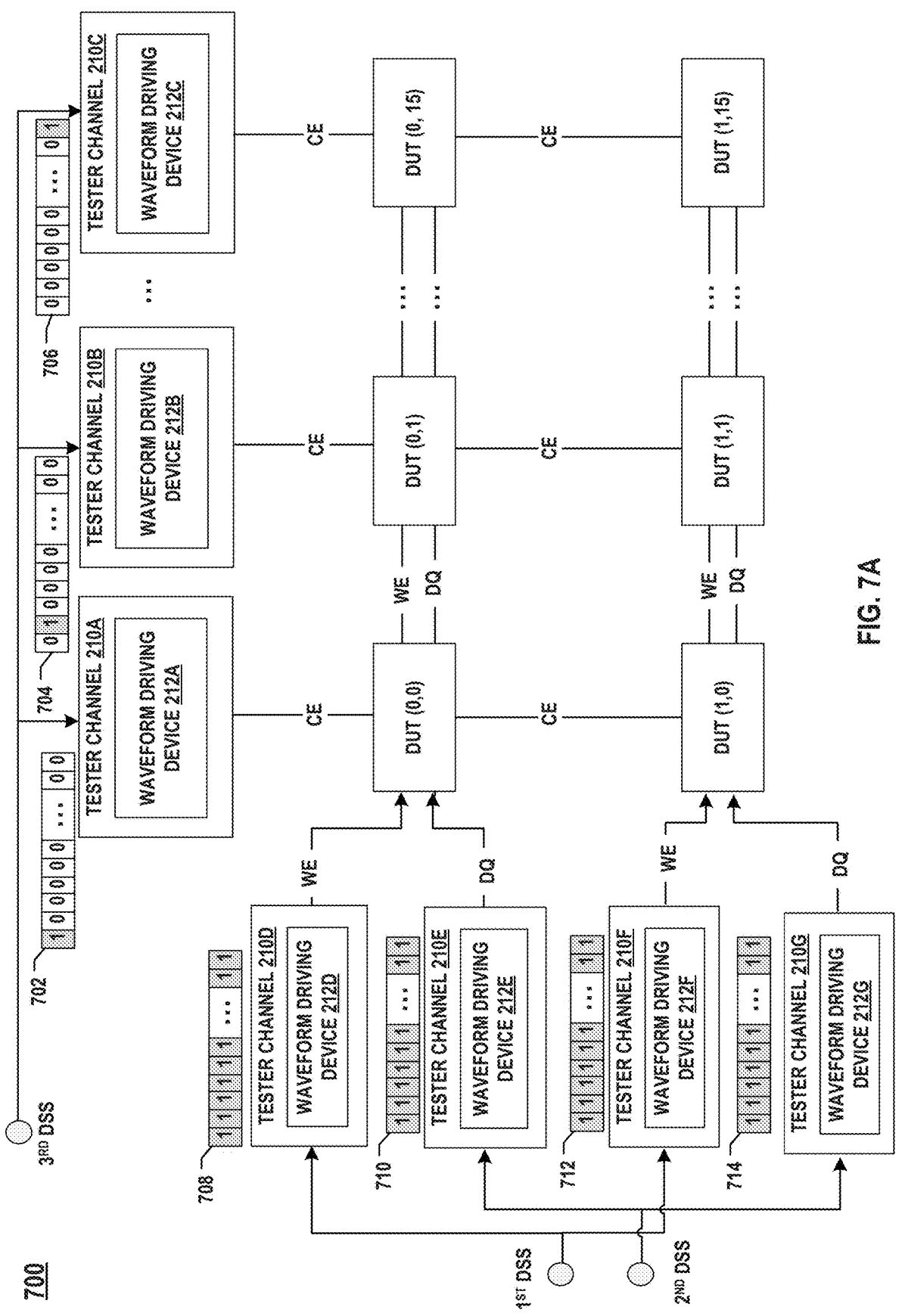
FIGS. 7A-7B illustrate graphical representations of exemplary application scenarios of a control process for controlling one or more tester channels multiplexed by a plurality of DUTs, according to some aspects of the present disclosure.
Figure 7B:
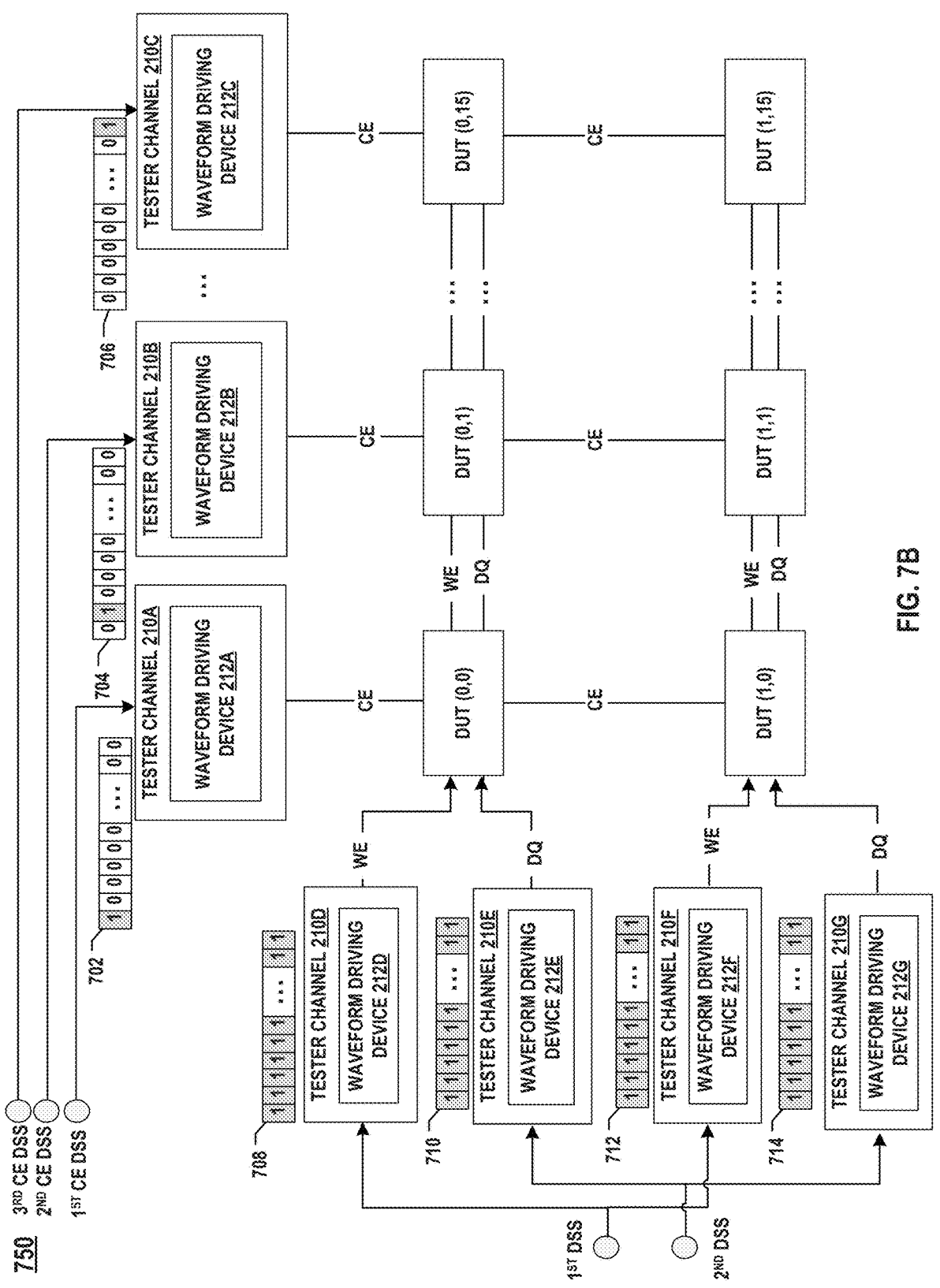

FIGS. 7A-7B illustrate graphical representations of exemplary application scenarios 700 and 750 of a control process for controlling one or more tester channels multiplexed by a plurality of DUTs, according to some aspects of the present disclosure. There may be a DUT array (e.g., a total of 32 DUTs arranged in two rows and 16 columns) to be tested in FIGS. 7A-7B. A first row of the DUT array may include DUT (0,0), DUT (0,1), . . . , and DUT (0,15), and a second row of the DUT array may include DUT (1,0), DUT (1,1), . . . , and DUT (1,15). Each DUT in the DUT array can be a memory device, such as NAND flash memory, DRAM, or the like; and each of the memory devices is provided with a CE pin, a DQ pin, and a WE pin at least.

Referring to FIG. 7A, a test equipment may include tester channels 210A, 210B, 210C, 210D, 210E, 210F, and 210G. The test equipment used in FIG. 7A can also include other components like those of test equipment 204, and the similar descriptions will not be repeated here. Tester channels 210A, 210B, 210C, 210D, 210E, 210F, and 210G may include waveform driving devices 212A, 212B, 212C, 212D, 212E, 212F, and 212G, respectively. Waveform driving devices 212A, 212B, 212C, 212D, 212E, 212F, and 212G may include bit map registers for storing bit maps 702, 704, 706, 708, 710, 712, and 714, respectively. In an example, the size of the bit maps 702, 704, 706, 708, 710, 712, and 714 can be set according to the number of the plurality of DUTs 214 connected to tester channel 210E or tester channel 210E multiplexed by DQ pins of the number of the plurality of DUTs.

CE pins of DUTs in each column of the DUT array are coupled to the same tester channel. For example, CE pins of DUTs in each column of the DUT array are physically coupled to the same tester channel. Specifically, tester channel 210A is multiplexed by CE pins of DUT (0,0) and DUT (1,0), such that tester channel 210A is coupled to and configured to drive the CE pins of DUT (0,0) and DUT (1,0). Tester channel 210B is multiplexed by CE pins of DUT (0,1) and DUT (1,1), such that tester channel 210B is coupled to and configured to drive the CE pins of DUT (0,1) and DUT (1,1). Tester channel 210C is multiplexed by CE pins of DUT (0,15) and DUT (1,15), such that tester channel 210C is coupled to and configured to drive the CE pins of DUT (0,15) and DUT (1,15).

WE pins of DUTs in each row of the DUT array are coupled to the same tester channel. For example, tester channel 210D is multiplexed by WE pins of DUT (0,0), DUT (0,1), . . . , and DUT (0,15), such that tester channel 210D is coupled to and configured to drive the WE pins of DUT (0,0), DUT (0,1), . . . , and DUT (0,15). Tester channel 210F is multiplexed by WE pins of DUT (1,0), DUT (1,1), . . . , and DUT (1,15), such that tester channel 210F is coupled to and configured to drive the WE pins of DUT (1,0), DUT (1,1), . . . , and DUT (1,15).

DQ pins of DUTs in each row of the DUT array are coupled to the same tester channel. For example, tester channel 210E is multiplexed by DQ pins of DUT (0,0), DUT (0,1), . . . , and DUT (0,15), such that tester channel 210E is coupled to and configured to drive the DQ pins of DUT (0,0), DUT (0,1), . . . , and DUT (0,15). Tester channel 210G is multiplexed by DQ pins of DUT (1,0), DUT (1,1), . . . , and DUT (1,15), such that tester channel 210G is coupled to and configured to drive the DQ pins of DUT (1,0), DUT (1,1), . . . , and DUT (1,15).

The test equipment of FIG. 7A may provide a first driving source signal to tester channels 210D and 210F to generate a first WE waveform signal and a second WE waveform signal, respectively. Since all bit control signals in bit map 708 of tester channel 210D are "1", tester channel 210D is enabled to output the first WE waveform signal to the WE pins of DUTs in the first row of the DUT array, regardless of what a value of the selection index is. Similarly, since all bit control signals in bit map 712 of tester channel 210F are "1", tester channel 210F is enabled to output the second WE waveform signal to the WE pins of DUTs in the second row of the DUT array, regardless of what the value of the selection index is. As a result, the WE pins of all the DUTs in the DUT array are activated regardless of the value of the selection index.

Similarly, the test equipment of FIG. 7A may provide a second driving source signal to tester channels 210E and 210G to generate a first DQ waveform signal and a second DQ waveform signal, respectively. Since all bit control signals in bit maps 710 and 714 of tester channels 210E and 210G are "1", tester channel 210E is enabled to output the first DQ waveform signal to the DQ pins of DUTs in the first row of the DUT array, and tester channel 210G is enabled to output the second DQ waveform signal to the DQ pins of DUTs in the second row of the DUT array, regardless of what the value of the selection index is. As a result, the DQ pins of all the DUTs in the DUT array are activated regardless of what the value of the selection index is.

The test equipment of FIG. 7A may provide a third driving source signal (e.g., a CE driving source signal) to tester channels 210A, 210B, 210C and other tester channels coupled to the CE pins of DUTs in other columns (which are not shown in FIG. 7A), so that a first CE waveform signal, a second CE waveform signal, a third CE waveform signal, and other CE waveform signals are generated, respectively. In FIG. 7A, a DSS-to-TCh mapping relationship between the CE driving source signal and the tester channels is 1:16 (e.g., DSS:TCh=1:16 for the CE driving source signal). When the selection index is equal to 0, tester channel 210A is enabled to output the first CE waveform signal to the CE pins of DUTs in the first column of the DUT array based on bit map 702 of tester channel 210A. Other tester channels 210B and 210C are disabled and are inhibited to output the second and third CE waveform signals, respectively. In this case, a default output signal can be outputted through tester channel 210B (or 210C) to deactivate the CE pins of DUTs in the second (or fifteenth) column of the DUT array. As a result, only DUTs in the first column of the DUT array are selected to be tested when the selection index is equal to 0.

Similarly, when the selection index is equal to 1, tester channel 210B may be enabled to output the second CE waveform signal. Other tester channels 210A and 210C are disabled and are inhibited to output the first and third CE waveform signals, respectively. As a result, only DUTs in the second column of the DUT array are selected to be tested when the selection index is equal to 1. Similar operations may be performed when the selection index is equal to any integer between 2 and 15, and the similar descriptions will not be repeated here.

The selection index disclosed herein can be configured by a selection command in an ALPG instruction. For example, the selection index can be assigned with a value carried in the selection command, or can be incremented by 1 or decreased by 1 in the next test cycle. In some implementations, a select-all signal can be sent to each of tester channels 210A, 210B, 210C, and other tester channels coupled to the CE pins of DUTs in other columns, so that all DUTs in the DUT array can be selected to be tested simultaneously.

From the above description for FIG. 7A, it is noted that a selection of one or more DUTs in the DUT array may be achieved through a configuration of the bit maps. By changing the value of the selection index, different DUTs from the DUT array can be selected based on the bit maps. For example, as shown above, when the selection index is equal to 0, DUT (0,0) and DUT (1,0) can be selected based on bit map 702. By changing the selection index to be 1, DUT (0,1) and DUT (1,1) can be selected based on bit map 704. It is noted that the selection of the DUTs can also be changed by modifying the configuration of the bit maps.

Referring to FIG. 7B, a test equipment in FIG. 7B may have components like those of the test equipment in FIG. 7A, and the similar descriptions will not be repeated here. The test equipment of FIG. 7B may provide a first CE driving source signal to tester channel 210A, a second CE driving source signal to tester channel 210B, a third CE driving source signal to tester channel 210C, and other CE driving source signals to other tester channels coupled to the CE pins of DUTs in other columns (which are not shown in FIG. 7B). Then, the test equipment of FIG. 7B may generate a first CE waveform signal, a second CE waveform signal, a third CE waveform signal, and other CE waveform signals, respectively. In FIG. 7B, a DSS-to-TCh mapping relationship between the CE driving source signals and the tester channels is 1:1 (e.g., DSS:TCh=1:1 for each CE driving source signal).

When the selection index is equal to 0, tester channel 210A is enabled to output the first CE waveform signal to the CE pins of DUTs in the first column of the DUT array based on bit map 702 of tester channel 210A. Other tester channels 210B and 210C are disabled and are inhibited to output the second and third CE waveform signals, respectively. As a result, only DUTs in the first column of the DUT array are selected to be tested when the selection index is equal to 0. Similarly, when the selection index is equal to 1, tester channel 210B may be enabled to output the second CE waveform signal. Other tester channels 210A and 210C are disabled and are inhibited to output the first and third CE waveform signals, respectively. As a result, only DUTs in the second column of the DUT array are selected to be tested when the selection index is equal to 1. Similar operations may be performed when the selection index is equal to any integer between 2 and 15, and the similar descriptions will not be repeated here.

Compared with a configuration of the test equipment in FIG. 7A, a configuration of the test equipment in FIG. 7B may achieve similar functions but needs more CE driving source signals (e.g., one CE driving source signal for each tester channel), which can result in resource waste on the CE driving source signals. Thus, compared to the test equipment of FIG. 7B, the configuration of the test equipment in FIG. 7A may achieve higher efficiency with respect to resource utilization.

FIG. 8 illustrates a flowchart of a method 800 for controlling one or more tester channels in a test equipment, according to some aspects of the present disclosure. Method 800 may be implemented by components of test equipment 204. It is understood that the operations shown in method 800 may not be exhaustive and that other operations can be performed as well before, after, or between any of the illustrated operations. Further, some of the operations may be performed simultaneously, or in a different order than shown in FIG. 8.

In some implementations, the one or more tester channels are coupled to a plurality of DUTs such that each tester channel is multiplexed by the plurality of DUTs.

Referring to FIG. 8, method 800 starts at operation 802, in which a selection index is generated based on a selection command. For example, selection register 208 may generate and store the selection index based on the selection command.

Method 800 proceeds to operation 804, as illustrated in FIG. 8, in which one or more waveform signals are generated for the one or more tester channels based on a driving source signal, respectively. For example, waveform generator 404 in each tester channel may generate a corresponding waveform signal for the tester channel based on the driving source signal and a timing format.

Method 800 proceeds to operation 806, as illustrated in FIG. 8, in which an output of the one or more waveform signals through the one or more tester channels, respectively, is controlled based on the selection index and one or more bit maps associated with the one or more tester channels. In some implementations, for each tester channel associated with a corresponding bit map and a corresponding waveform signal, a bit control signal is selected from the corresponding bit map based on the selection index. Responsive to the bit control signal being an enabled signal, the corresponding waveform signal is outputted through the tester channel. Or, responsive to the bit control signal being a disabled signal, the corresponding waveform signal is inhibited from outputting through the tester channel. In some implementations, a select-all signal indicative of a selection of the one or more tester channels can be received. The one or more waveform signals may be outputted through the one or more tester channels, respectively, responsive to receiving the select-all signal.

In some implementations, the one or more tester channels may include a first tester channel and a second tester channel. The one or more bit maps may include a first bit map associated with the first tester channel and a second bit map associated with the second tester channel. The one or more waveform signals may include a first waveform signal for the first tester channel and a second waveform signal for the second tester channel. An output of the first waveform signal through the first tester channel may be controlled based on the first bit map and the selection index. An output of the second waveform signal through the second tester channel may be controlled based on the second bit map and the selection index.

According to one aspect of the present disclosure, a waveform driving device for a tester channel includes a waveform generator, a bit map register, and an output logic circuit. The waveform generator is configured to generate a waveform signal based on a driving source signal. The bit map register is configured to store a bit map associated with the tester channel. The output logic circuit is coupled to the bit map register and the waveform generator, and configured to control an output of the waveform signal through the tester channel based on a bit control signal from the bit map.

In some implementations, to control the output of the waveform signal through the tester channel, the output logic circuit is further configured to: responsive to the bit control signal being an enabled signal, output the waveform signal through the tester channel; or responsive to the bit control signal being a disabled signal, inhibit the waveform signal from outputting through the tester channel.

In some implementations, the output logic circuit includes an OR gate and a multiplexer. The OR gate is coupled to the bit map register to receive the bit control signal from the bit map register, and configured to generate an OR output based on the bit control signal. The multiplexer is coupled to the OR gate and the waveform generator to receive the OR output and the waveform signal, respectively, and configured to control the output of the waveform signal through the tester channel based on the OR output.

In some implementations, the OR gate is configured to generate the OR output further based on a select-all signal indicative of a selection of the tester channel.

In some implementations, to control the output of the waveform signal through the tester channel based on the OR output, the multiplexer is further configured to: responsive to the OR output being an enabled signal, output the waveform signal through the tester channel; or responsive to the OR output being a disabled signal, output a default output signal through the tester channel.

In some implementations, the bit map includes a plurality of bit control signals. The bit map register is further configured to select the bit control signal from the plurality of bit control signals based on a selection index.

In some implementations, the selection index includes an ID of the bit control signal in the bit map.

In some implementations, a total number of the plurality of bit control signals in the bit map is set based on a total number of a plurality of DUTs coupled to the tester channel.

In some implementations, each of the plurality of DUTs is a memory device including a data (DQ) pin. The total number of the plurality of bit control signals in the bit map is set according to a total number of the plurality of DUTs coupled to the tester channel multiplexed by DQ pins of the plurality of DUTs.

In some implementations, the tester channel is multiplexed by the plurality of DUTs such that the waveform driving device in the tester channel is coupled to and configured to drive a plurality of pins from the plurality of DUTs, respectively.

In some implementations, the driving source signal includes an address pattern, a data pattern, or a control pattern.

In some implementations, the waveform generator is configured to generate the waveform signal further based on a timing format.

According to another aspect of the present disclosure, a test equipment includes a plurality of tester channels. Each of the tester channels includes a waveform generator, a bit map register, and an output logic circuit. The waveform generator is configured to generate a waveform signal based on a driving source signal. The bit map register is configured to store a bit map associated with the tester channel. The output logic circuit is coupled to the bit map register and the waveform generator, and configured to control an output of the waveform signal through the tester channel based on a bit control signal from the bit map.

In some implementations, to control the output of the waveform signal through the tester channel, the output logic circuit is further configured to, responsive to the bit control signal being an enabled signal, output the waveform signal through the tester channel, or responsive to the bit control signal being a disabled signal, inhibit the waveform signal from outputting through the tester channel.

In some implementations, the output logic circuit includes an OR gate and a multiplexer. The OR gate is coupled to the bit map register to receive the bit control signal from the bit map register, and configured to generate an OR output based on the bit control signal. The multiplexer is coupled to the OR gate and the waveform generator to receive the OR output and the waveform signal, respectively, and configured to control the output of the waveform signal through the tester channel based on the OR output.

In some implementations, the OR gate is configured to generate the OR output further based on a select-all signal indicative of a selection of the tester channel.

In some implementations, to control the output of the waveform signal through the tester channel based on the OR output, the multiplexer is further configured to responsive to the OR output being an enabled signal, output the waveform signal through the tester channel, or responsive to the OR output being a disabled signal, output a default output signal through the tester channel.

In some implementations, the waveform generator is configured to generate the waveform signal further based on a timing format.

In some implementations, the plurality of tester channels are coupled to a plurality of devices under test (DUTs) such that each tester channel is multiplexed by the plurality of DUTs.

In some implementations, the plurality of DUTs are arranged in an array. First pins of DUTs in each column of the array are coupled to a corresponding tester channel from the plurality of tester channels. Second pins of DUTs in each row of the array are coupled to another corresponding tester channel from the plurality of tester channels.

According to yet another aspect of the present disclosure, a test equipment includes a selection register and one or more waveform driving devices for one or more tester channels. The selection register is configured to store a selection index. The selection index is determined based on a selection command. The one or more waveform driving devices are coupled to the selection register and configured to generate one or more waveform signals for the one or more tester channels based on a driving source signal, respectively. The one or more waveform driving devices are further configured to control an output of the one or more waveform signals through the one or more tester channels, respectively, based on the selection index and one or more bit maps associated with the one or more tester channels.

In some implementations, each waveform driving device for a corresponding tester channel includes a waveform generator, a bit map register, and an output logic circuit. The waveform generator is configured to generate a corresponding waveform signal for the corresponding tester channel based on the driving source signal. The bit map register is configured to store a corresponding bit map associated with the corresponding tester channel and select a bit control signal from the corresponding bit map based on the selection index. The output logic circuit is coupled to the bit map register and the waveform generator, and configured to control an output of the corresponding waveform signal through the corresponding tester channel based on the bit control signal.

In some implementations, to control the output of the corresponding waveform signal through the corresponding tester channel, the output logic circuit is further configured to responsive to the bit control signal being an enabled signal, output the corresponding waveform signal through the corresponding tester channel. Or, the output logic circuit is further configured to responsive to the bit control signal being a disabled signal, inhibit the corresponding waveform signal from outputting through the corresponding tester channel.

In some implementations, the output logic circuit includes an OR gate and a multiplexer. The OR gate is coupled to the bit map register to receive the bit control signal from the bit map register, and configured to generate an OR output based on the bit control signal. The multiplexer is coupled to the OR gate and the waveform generator to receive the OR output and the corresponding waveform signal, respectively, and configured to control the output of the corresponding waveform signal through the corresponding tester channel based on the OR output.

In some implementations, the OR gate is configured to generate the OR output further based on a select-all signal indicative of a selection of the one or more tester channels.

In some implementations, to control the output of the corresponding waveform signal through the corresponding tester channel based on the OR output, the multiplexer is further configured to: responsive to the OR output being an enabled signal, output the corresponding waveform signal through the corresponding tester channel; or responsive to the OR output being a disabled signal, output a default output signal through the corresponding tester channel.

In some implementations, the one or more tester channels are coupled to a plurality of DUTs such that each tester channel is multiplexed by the plurality of DUTs.

In some implementations, the one or more tester channels include a first tester channel and a second tester channel. The one or more waveform driving devices include a first waveform driving device for the first tester channel and a second waveform driving device for the second tester channel. The first waveform driving device is coupled to and configured to drive a plurality of first pins from the plurality of DUTs, respectively. The second waveform driving device is coupled to and configured to drive a plurality of second pins from the plurality of DUTs, respectively.

In some implementations, the first waveform driving device is configured to generate a first waveform signal based on the driving source signal. The second waveform driving device is configured to generate a second waveform signal based on the driving source signal. An output control of the first waveform signal through the first tester channel is independent from an output control of the second waveform signal through the second tester channel.

In some implementations, the first waveform signal is different from the second waveform signal.

In some implementations, each of the one or more bit maps includes a plurality of bit control signals. A total number of the plurality of bit control signals is set based on a total number of the plurality of DUTs coupled to the one or more tester channels.

In some implementations, each of the plurality of DUTs is a memory device including a data (DQ) pin. The total number of the plurality of bit control signals in the bit map is set according to a total number of the plurality of DUTs coupled to the tester channel multiplexed by DQ pins of the plurality of DUTs.

In some implementations, the driving source signal includes an address pattern, a data pattern, or a control pattern.

In some implementations, the one or more waveform generators are configured to generate the one or more waveform signals further based on one or more timing formats for the one or more tester channels, respectively.

According to still another aspect of the present disclosure, a method for controlling one or more tester channels in a test equipment is disclosed. A selection index is generated based on a selection command. One or more waveform signals for the one or more tester channels are generated based on a driving source signal, respectively. An output of the one or more waveform signals through the one or more tester channels, respectively, is controlled based on the selection index and one or more bit maps associated with the one or more tester channels.

In some implementations, the one or more tester channels are coupled to a plurality of DUTs such that each tester channel is multiplexed by the plurality of DUTs.

In some implementations, the one or more tester channels include a first tester channel and a second tester channel. The one or more bit maps include a first bit map associated with the first tester channel and a second bit map associated with the second tester channel. The one or more waveform signals include a first waveform signal for the first tester channel and a second waveform signal for the second tester channel. Controlling the output of the one or more waveform signals through the one or more tester channels, respectively, includes: controlling an output of the first waveform signal through the first tester channel to a plurality of first pins from the plurality of DUTs based on the first bit map and the selection index; and controlling an output of the second waveform signal through the second tester channel to a plurality of second pins from the plurality of DUTs based on the second bit map and the selection index.

In some implementations, the first waveform signal is generated based on the driving source signal. The second waveform signal is generated based on the driving source signal.

In some implementations, the first waveform signal is different from the second waveform signal.

In some implementations, each bit map includes a plurality of bit control signals. A total number of the plurality of bit control signals in each bit map is set based on a total number of the plurality of DUTs coupled to the one or more tester channels.

In some implementations, each of the plurality of DUTs is a memory device including a data (DQ) pin. The total number of the plurality of bit control signals in the bit map is set according to a total number of the plurality of DUTs coupled to the tester channel multiplexed by DQ pins of the plurality of DUTs.

In some implementations, controlling the output of the one or more waveform signals through the one or more tester channels, respectively, includes: for each tester channel associated with a corresponding bit map and a corresponding waveform signal, selecting a bit control signal from the corresponding bit map based on the selection index; responsive to the bit control signal being an enabled signal, outputting the corresponding waveform signal through the tester channel; or responsive to the bit control signal being a disabled signal, inhibiting the corresponding waveform signal from outputting through the tester channel.

In some implementations, controlling the output of the one or more waveform signals through the one or more tester channels, respectively, includes: receiving a select-all signal indicative of a selection of the one or more tester channels; and outputting the one or more waveform signals through the one or more tester channels, respectively, responsive to receiving the select-all signal.

In some implementations, the driving source signal includes an address pattern, a data pattern, or a control pattern.

In some implementations, generating the one or more waveform signals includes generating the one or more waveform signals based on the driving source signal and one or more timing formats for the one or more tester channels, respectively.

According to still another aspect of the present disclosure, a method for controlling a tester channel in a test equipment is disclosed. A bit map associated with the tester channel is obtained. A waveform signal is generated based on at least one of a driving source signal or a timing format. An output of the waveform signal through the tester channel is controlled based on a bit control signal from the bit map.

In some implementations, controlling the output of the waveform signal through the tester channel includes responsive to the bit control signal being an enabled signal, outputting the waveform signal through the tester channel, or responsive to the bit control signal being a disabled signal, inhibiting the waveform signal from outputting through the tester channel.

In some implementations, the bit map includes a plurality of bit control signals. The bit control signal is selected from the plurality of bit control signals based on a selection index.

In some implementations, a total number of the plurality of bit control signals in the bit map is set based on a total number of a plurality of devices under test (DUTs) coupled to the tester channel.

In some implementations, each of the plurality of DUTs is a memory device including a data (DQ) pin. The total number of the plurality of bit control signals in the bit map is set according to a total number of the plurality of DUTs coupled to the tester channel multiplexed by DQ pins of the plurality of DUTs.

In some implementations, the tester channel is multiplexed by the plurality of DUTs such that the tester channel is configured to drive a plurality of pins from the plurality of DUTs, respectively.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A test equipment, comprising:
a selection register configured to store a selection index, the selection index being determined based on a selection command;
a first tester channel comprising a first waveform driving device; and
a second tester channel comprising a second waveform driving device,
wherein each of the first tester channel and the second tester channel is multiplexed by a plurality of Device Under Test (DUTs), the first waveform driving device and the second waveform driving device are coupled to the selection register;
the first waveform driving device is configured to:
generate, based on a driving source signal, a first waveform signal for driving multiple of first pins of the plurality of DUTs; and
control, based on the selection index and a first bit map corresponding to the first tester channel, an output of the first waveform signal through the first tester channel; and
the second waveform driving device is configured to:
generate, based on the driving source signal, a second waveform signal for driving multiple of second pins of the plurality of DUTs; and
control, based on the selection index and a second bit map corresponding to the second tester channel, an output of the second waveform signal through the second tester channel.

2. The test equipment of claim 1, wherein the first waveform driving device is further configured to:
control the output of the first waveform signal independently of an output control of the second waveform signal.

3. The test equipment of claim 1, wherein the first waveform driving device comprises:
a waveform generator configured to generate the first waveform signal for the first tester channel based on the driving source signal;

a bit map register configured to store the first bit map associated with the first tester channel and select a bit control signal from the first bit map based on the selection index; and
an output logic circuit coupled to the bit map register and the waveform generator, and configured to control an output of the first waveform signal through the first tester channel based on the bit control signal.

4. The test equipment of claim 3, wherein to control the output of the first waveform signal through the first tester channel, the output logic circuit is further configured to:
responsive to the bit control signal being an enabled signal, output the first waveform signal through the first tester channel; or
responsive to the bit control signal being a disabled signal, inhibit the first waveform signal from outputting through the first tester channel.

5. The test equipment of claim 3, wherein the output logic circuit comprises:
an OR gate coupled to the bit map register to receive the bit control signal from the bit map register, and configured to generate an OR output based on the bit control signal; and
a multiplexer coupled to the OR gate and the waveform generator to receive the OR output and a corresponding waveform signal, respectively, and configured to control the output of the corresponding waveform signal through a corresponding tester channel based on the OR output.

6. The test equipment of claim 5, wherein the OR gate is configured to generate the OR output further based on a select-all signal indicative of a selection of the first tester channel or the second tester channel.

7. The test equipment of claim 5, wherein to control the output of the corresponding waveform signal through the corresponding tester channel based on the OR output, the multiplexer is further configured to:
responsive to the OR output being an enabled signal, output the corresponding waveform signal through the corresponding tester channel; or
responsive to the OR output being a disabled signal, output a default output signal through the corresponding tester channel.

8. The test equipment of claim 1, wherein the second waveform driving device comprises:
a waveform generator configured to generate the second waveform signal for the second tester channel based on the driving source signal;
a bit map register configured to store the second bit map associated with the second tester channel and select a bit control signal from the second bit map based on the selection index; and
an output logic circuit coupled to the bit map register and the waveform generator, and configured to control an output of the second waveform signal through the second tester channel based on the bit control signal.

9. The test equipment of claim 8, wherein to control the output of the second waveform signal through the second tester channel, the output logic circuit is further configured to:
responsive to the bit control signal being an enabled signal, output the second waveform signal through the second tester channel; or
responsive to the bit control signal being a disabled signal, inhibit the second waveform signal from outputting through the second tester channel.

10. The test equipment of claim 1, wherein:

each of the first bit map and the second bit map comprises a plurality of bit control signals;

a total number of the plurality of bit control signals of the first bit map is set based on a total number of the plurality of DUTs coupled to the first tester channel; and a total number of the plurality of bit control signals of the second bit map is set based on a total number of the plurality of DUTs coupled to the second tester channel.

11. The test equipment of claim 10, wherein each of the plurality of DUTs is a memory device including a data (DQ) pin;

the total number of the plurality of bit control signals in the first bit map is set according to a total number of the plurality of DUTs coupled to the first tester channel multiplexed by DQ pins of the plurality of DUTs; and the total number of the plurality of bit control signals in the second bit map is set according to a total number of the plurality of DUTs coupled to the second tester channel multiplexed by DQ pins of the plurality of DUTs.

12. The test equipment of claim 1, wherein the driving source signal comprises an address pattern, a data pattern, or a control pattern.

13. A method for controlling one or more tester channels in a test equipment, comprising:

generating a selection index based on a selection command;

generating one or more waveform signals for the one or more tester channels based on a driving source signal, respectively; and controlling an output of the one or more waveform signals through the one or more tester channels, respectively, based on the selection index and one or more bit maps associated with the one or more tester channels.

14. The method of claim 13, wherein the one or more tester channels are coupled to a plurality of devices under test (DUTs) such that each tester channel is multiplexed by the plurality of DUTs.

15. The method of claim 14, wherein:

the one or more tester channels comprise a first tester channel and a second tester channel;

the one or more bit maps comprise a first bit map associated with the first tester channel and a second bit map associated with the second tester channel;

the one or more waveform signals comprise a first waveform signal for the first tester channel and a second waveform signal for the second tester channel; and controlling the output of the one or more waveform signals through the one or more tester channels, respectively, comprises:

controlling an output of the first waveform signal through the first tester channel to a plurality of first pins from the plurality of DUTs based on the first bit map and the selection index; and controlling an output of the second waveform signal through the second tester channel to a plurality of second pins from the plurality of DUTs based on the second bit map and the selection index.

16. The method of claim 15, further comprising:

generating the first waveform signal based on the driving source signal; and generating the second waveform signal based on the driving source signal.

17. The method of claim 15, wherein the first waveform signal is different from the second waveform signal.

18. A test equipment, comprising:

a selection register configured to store a selection index, the selection index being determined based on a selection command; and one or more waveform driving devices for one or more tester channels, the one or more waveform driving devices coupled to the selection register and configured to:

generate one or more waveform signals for the one or more tester channels based on a driving source signal, respectively; and control an output of the one or more waveform signals through the one or more tester channels, respectively, based on the selection index and one or more bit maps associated with the one or more tester channels.

19. The test equipment of claim 18, wherein each waveform driving device for a corresponding tester channel comprises:

a waveform generator configured to generate a corresponding waveform signal for the corresponding tester channel based on the driving source signal;

a bit map register configured to store a corresponding bit map associated with the corresponding tester channel and select a bit control signal from the corresponding bit map based on the selection index; and an output logic circuit coupled to the bit map register and the waveform generator, and configured to control an output of the corresponding waveform signal through the corresponding tester channel based on the bit control signal.

20. The test equipment of claim 18, wherein the one or more tester channels are coupled to a plurality of devices under test (DUTs) such that each tester channel is multiplexed by the plurality of DUTs.

* * * * *